United States Patent
Aizawa et al.

(10) Patent No.: US 11,322,385 B2
(45) Date of Patent: *May 3, 2022

(54) ADHESIVE TAPE FOR SEMICONDUCTOR PROCESSING, AND SEMICONDUCTOR DEVICE MANUFACTURING METHOD

(71) Applicant: LINTEC Corporation, Tokyo (JP)

(72) Inventors: Kazuto Aizawa, Tokyo (JP); Jun Maeda, Tokyo (JP)

(73) Assignee: LINTEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/083,462

(22) Filed: Oct. 29, 2020

(65) Prior Publication Data

US 2021/0043492 A1 Feb. 11, 2021

Related U.S. Application Data

(63) Continuation of application No. 16/338,524, filed as application No. PCT/JP2017/035599 on Sep. 29, 2017, now Pat. No. 10,854,495.

(30) Foreign Application Priority Data

Oct. 3, 2016 (JP) ................................ 2016-195996

(51) Int. Cl.
*H01L 21/683* (2006.01)
*C09J 201/00* (2006.01)
(Continued)

(52) U.S. Cl.
CPC ............ *H01L 21/6836* (2013.01); *C09J 7/38* (2018.01); *C09J 201/00* (2013.01);
(Continued)

(58) Field of Classification Search
None
See application file for complete search history.

(56) References Cited

U.S. PATENT DOCUMENTS 8,337,656 B2 12/2012 Nishio et al.
10,460,973 B2 * 10/2019 Tominaga ................ C09J 7/385
(Continued)

FOREIGN PATENT DOCUMENTS

JP 2008214386 A 9/2008
JP 2009275060 A 11/2009
(Continued)

OTHER PUBLICATIONS

International Preliminary Report on Patentability, dated Apr. 18, 2019.
(Continued)

*Primary Examiner* — J. E. Schoenholtz
(74) *Attorney, Agent, or Firm* — Cahn & Samuels, LLP

(57) ABSTRACT

A pressure sensitive adhesive tape for semiconductor processing includes a base having a Young's modulus of 1000 MPa or more at 23° C., and a pressure sensitive adhesive layer provided on at least one surface of the base, and the product (N)×(C) of (N) and (C) is 500 or more at 30° C., and 9000 or less at 60° C., where (N) [μm] is a thickness of the pressure sensitive adhesive layer and (C) [μm] is a creep amount.

4 Claims, 1 Drawing Sheet

(51) Int. Cl.
  *H01L 21/304*   (2006.01)
  *H01L 21/78*    (2006.01)
  *C09J 7/38*     (2018.01)

(52) U.S. Cl.
  CPC ............ *H01L 21/304* (2013.01); *H01L 21/78* (2013.01); *C09J 2301/312* (2020.08); *H01L 2221/68327* (2013.01)

(56) References Cited

U.S. PATENT DOCUMENTS

| | | | | |
|---|---|---|---|---|
| 10,854,495 | B2* | 12/2020 | Aizawa | C08F 222/1065 |
| 2005/0269717 | A1* | 12/2005 | Ohashi | C09J 7/29 |
| | | | | 257/783 |
| 2006/0134406 | A1 | 6/2006 | Horigome et al. | |
| 2007/0238805 | A1 | 10/2007 | Maeda et al. | |
| 2010/0239866 | A1* | 9/2010 | Matsumura | C09J 133/066 |
| | | | | 428/413 |
| 2011/0067808 | A1* | 3/2011 | Nishio | H01L 21/6835 |
| | | | | 156/247 |
| 2011/0195561 | A1 | 8/2011 | Maeda et al. | |
| 2014/0079947 | A1* | 3/2014 | Tamura | C09J 7/385 |
| | | | | 428/354 |
| 2016/0240523 | A1* | 8/2016 | Takamoto | H01L 25/50 |
| 2017/0025303 | A1 | 1/2017 | Morita et al. | |
| 2019/0382633 | A1* | 12/2019 | Aizawa | C08F 290/067 |

FOREIGN PATENT DOCUMENTS

| | | |
|---|---|---|
| JP | 2014185285 A | 10/2014 |
| JP | 2015133435 A | 7/2015 |
| JP | 2015183008 A | 10/2015 |
| KR | 20150110349 A | 10/2015 |
| WO | 2014203792 A1 | 12/2014 |
| WO | 2013136897 A1 | 8/2015 |
| WO | 2015/156389 A1 | 10/2015 |
| WO | 2018/066480 A1 | 4/2018 |

OTHER PUBLICATIONS

English Abstract of JP 2009275060 A, Nov. 26, 2009.
English Abstract of WO 2013136897 A1, Aug. 3, 2015.
English Abstract of JP 2015183008 A, Oct. 22, 2015.
English Abstract of JP 2015133435 A, Jul. 23, 2015.
English Abstract of WO 2014203792 A1, Dec. 24, 2014.
English Abstract of JP 2008214386 A, Sep. 18, 2008.
English Abstract of WO 2015/156389 A1, Oct. 15, 2015.
English Abstract of WO 2018/066480 A1, Apr. 12, 2018.
English Abstract for KR20150110349 A, printed on Dec. 15, 2020.
English Abstract for JP2014185285 A, Oct. 2, 2014.

* cited by examiner

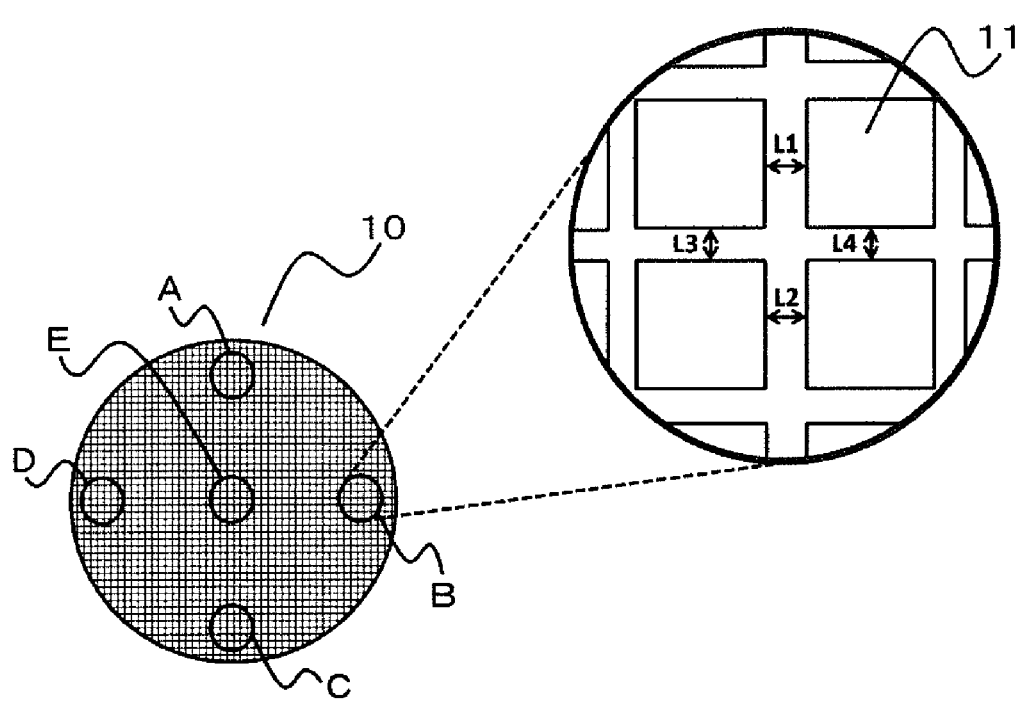

ADHESIVE TAPE FOR SEMICONDUCTOR PROCESSING, AND SEMICONDUCTOR DEVICE MANUFACTURING METHOD

The present application is a Continuation Application of U.S. Ser. No. 16/338,524, filed in the U.S. Patent and Trademark Office on 1 Apr. 2019, which is a U.S. national stage application of PCT/JP2017/035599 filed on 29 Sep. 2017 and claims priority to Japanese patent document 2016-195996 filed on 3 Oct. 2016, the entireties of which are incorporated herein by reference.

BACKGROUND OF THE INVENTION

The present invention relates to pressure sensitive adhesive tapes for semiconductor processing, and more particularly to pressure sensitive adhesive tapes preferably used for temporarily retaining a semiconductor wafer or chips when producing a semiconductor device utilizing an approach of providing a modified region inside the wafer by a laser and dicing the wafer by means of, for example, a stress applied when the back surface of the wafer is ground, and a method for producing a semiconductor device using the pressure sensitive adhesive tape.

In the course of further achieving downsizing and multi-functionality in various electronic devices, there is also a demand for smaller and thinner semiconductor chips to be mounted on such electronic devices. In order to reduce the thickness of the chips, it is generally performed to grind a back surface of a semiconductor wafer to adjust the thickness thereof. A method is also utilized to obtain thinner chips, which is referred to as Dicing before Grinding (DBG), wherein a groove having a predetermined depth is formed in a wafer from a front surface thereof by a dicing blade, which is followed by grinding from a back surface of the wafer and dicing the wafer by grinding to obtain chips. DBG achieves an efficient production of thin chips since it is capable of performing back side grinding and dicing of a wafer at the same time.

Conventionally, at the time of back side grinding of a semiconductor wafer or producing chips by DBG, it is common to apply a pressure sensitive adhesive tape referred to as a back side grind sheet to the wafer surface in order to protect circuits on the wafer surface and to retain the semiconductor wafer and semiconductor chips.

As the back side grind sheet used in DBG, a pressure sensitive adhesive tape is used, which includes a base and a pressure sensitive adhesive layer provided on one surface of the base. As an example of such a pressure sensitive adhesive tape, Patent Literature 1 (WO2015/156389A1) proposes a back side grind tape which includes: a base having a base film and a buffer layer; and a pressure sensitive adhesive layer provided on a surface of the base film opposite to the surface on which the buffer layer is provided. Patent Literature 1 discloses that the Young's modulus of the base film is 600 MPa or more, the buffer layer is formed of a urethane containing-cured material, and the peak temperature of tan δ of the buffer layer is 60° C. or less. In addition, Patent Literature 2 (Japanese Patent Application Publication No. 2015-183008) proposes an adhesive sheet which includes: a rigid base, and a buffer layer provided on one surface of the rigid base; and a pressure sensitive adhesive layer provided on the other surface of the rigid base. Patent Literature 2 discloses that the Young's modulus of the rigid base is 1000 MPa or more, the buffer layer is formed of a buffer layer-forming composition that contains an energy ray polymerizable compound, and a maximum value of tan δ of a dynamic viscoelasticity of the buffer layer is 0.5 or more at −5 to 120° C.

In recent years, as a modified example of Dicing before Grinding, a method has been proposed of providing a modified region inside a wafer by a laser and dicing the wafer by means of, for example, a stress applied when back side grinding of the wafer. Hereinafter, this method may be referred to as LDBG (Laser Dicing before Grinding). Compared to Dicing before Grinding using a dicing blade, LDBG achieves a reduction in occurrences of chipping, since the wafer is cut along the crystal orientation with the modified region as a starting point. It is thereby possible to obtain chips having excellent bending strength and contribute to further thinning of chips. In addition, when compared to DBG that forms a groove having a predetermined depth in the wafer surface by a dicing blade, LDBG achieves a high yield of chips since there is no region where a wafer is ground by a dicing blade, that is, the kerf width is minimum.

However, when the pressure sensitive adhesive tape described in each of Patent Literature 1 or 2 is used in DBG and LDBG, chipping or breakage of chips (which may hereinafter be referred to as "chip crack") may occur when the chips are thinned to 30 μm or less.

Patent Literature 1: WO 2015/156389 A1
Patent Literature 2: Japanese Patent Application Publication No. 2015-183008

BRIEF SUMMARY OF INVENTION

As a result of intensive studies to solve the foregoing problem, the present inventors have found that cracks are formed in chips because stresses (a compressive stress and a shear stress) at the time of back side grinding cause the chips to vibrate or move and thereby collide with one another. In LDBG, a kerf width is small, thus such cracks in chips are more frequently formed.

The present invention is made in view of the above-described prior art, and an object thereof is to provide a pressure sensitive adhesive tape for semiconductor processing that can suppress cracks of chips even when used in DBG, and particularly in LDBG, and further makes it possible that, when the pressure sensitive adhesive tape is adhered to an uneven surface of a wafer, the unevenness of the surface of the wafer and the pressure sensitive adhesive layer are adequately brought into contact with each other, and the adhesiveness of the pressure sensitive adhesive layer is appropriately exhibited.

The summary of the present invention aimed at solving such a problem is described below.

[1] A pressure sensitive adhesive tape for semiconductor processing including:
a base having a Young's modulus of 1000 MPa or more at 23° C., and a pressure sensitive adhesive layer, and wherein
the product (N)×(C) of (N) and (C) is 500 or more at 30° C., and 9000 or less at 60° C., where (N) [μm] is a thickness of the pressure sensitive adhesive layer and (C) [μm] is a creep amount.

[2] The pressure sensitive adhesive tape for semiconductor processing according to [1], wherein the pressure sensitive adhesive layer has a shear storage elastic modulus of 0.03 MPa or more at 30° C., and a shear storage elastic modulus of 0.20 MPa or less at 60° C.

[3] The pressure sensitive adhesive tape for semiconductor processing according to [1] or [2], wherein the pressure sensitive adhesive layer has a thickness of 100 μm or less.

[4] A method for producing a semiconductor device including steps of:

adhering the pressure sensitive adhesive tape for semiconductor processing according to any one of [1] to [3] above, to a front surface of a semiconductor wafer;

forming a groove from the front surface of the semiconductor wafer or forming a modified region inside the semiconductor wafer from the front surface or a back surface of the semiconductor wafer;

dicing the semiconductor wafer, of which the pressure sensitive adhesive tape is adhered to the front surface and the groove or the modified region is formed, using the groove or the modified region as a starting point for forming a plurality of chips by grinding the semiconductor wafer from the back surface; and releasing the pressure sensitive adhesive tape from the plurality of chips.

The pressure sensitive adhesive tape for semiconductor processing according to the present invention is resistant to deformation due to a stress at the time of back side grinding, and appropriately relaxes the stress. It is thereby possible to suppress vibration or movement of chips at the time of back side grinding to prevent collision of the chips with one another. As a result, occurrence of cracks in the semiconductor chips can be reduced. Furthermore, when the pressure sensitive adhesive tape is adhered to the uneven surface of the wafer, it is possible that the unevenness of the surface of the wafer and the pressure sensitive adhesive layer are adequately brought into contact with each other, and the adhesiveness of the pressure sensitive adhesive layer is appropriately exhibited.

BRIEF DESCRIPTION OF DRAWING

FIG. 1 is a schematic diagram illustrating a method of evaluating the magnitude of die shift in Examples.

DETAILED DESCRIPTION OF INVENTION

The pressure sensitive adhesive tape for semiconductor processing according to the present invention will be specifically described below. Firstly, important terms used in the present description will be described.

In the present description, for example, "(meth)acrylate" is used as a term indicating both "acrylate" and "methacrylate", and the same applies to other similar terms.

The term "for semiconductor processing" means that the semiconductor wafer can be used in each of steps such as carrying a semiconductor wafer, back side grinding, dicing, and picking up semiconductor chips.

A "front surface" of a semiconductor wafer refers to a surface on which circuits are formed, and a "back surface" refers to a surface on which no circuit is formed.

The dicing of a semiconductor wafer means dividing a semiconductor wafer into individual circuits to obtain semiconductor chips.

DBG refers to a method of forming a groove having a predetermined depth in a side of a front surface of a wafer, then performing grinding from a back surface of the wafer and dicing the wafer by grinding. The groove formed in the front surface of the wafer is formed by a method such as blade dicing, laser dicing, or plasma dicing. LDBG is a modified example of DBG, and refers to a method of providing a modified region inside a wafer by a laser and dicing the wafer by means of, for example, a stress applied when the back surface of the wafer is ground.

Secondly, the configurations of respective members of the pressure sensitive adhesive tape for semiconductor processing according to the present invention will now be described in further detail. In a first embodiment, descriptions will be given, focusing on properties of a buffer layer of a pressure sensitive adhesive tape that includes a base, the buffer layer provided on at least one surface of the base, and a pressure sensitive adhesive layer provided on the other surface of the base. In a second embodiment, descriptions will be given, focusing on properties of a pressure sensitive adhesive layer of a pressure sensitive adhesive tape that includes a base, and a pressure sensitive adhesive layer provided on at least one surface of the base. Hereinafter, the pressure sensitive adhesive tape for semiconductor processing according to the present invention may be simply referred to as an "pressure sensitive adhesive tape".

First Embodiment

The outline of the first embodiment of the present invention will now be given.

[1] A pressure sensitive adhesive tape for semiconductor processing including:

a base having a Young's modulus of 1000 MPa or more at 23° C., a buffer layer provided on at least one surface of the base, and a pressure sensitive adhesive layer provided on an other surface of the base, wherein the buffer layer has a tensile storage elastic modulus ($E_{23}$) of 100 to 2000 MPa at 23° C. and a tensile storage elastic modulus ($E_{60}$) of 20 to 1000 MPa at 60° C.

[2] The pressure sensitive adhesive tape for semiconductor processing according to [1], wherein a maximum value of tan δ of a dynamic viscoelasticity of the buffer layer is 1.0 or less at −5 to 120° C.

[3] The pressure sensitive adhesive tape for semiconductor processing according to [1] or [2], wherein the tensile storage elastic modulus ($E_{23}$) of the buffer layer at 23° C. and the tensile storage modulus ($E_{60}$) of the buffer layer at 60° C. satisfy $(E_{23})/(E_{60}) \leq 90$.

[4] The pressure sensitive adhesive tape for semiconductor processing according to any one of [1] to [3], wherein the buffer layer is a layer formed of a buffer layer-forming composition that contains an energy ray polymerizable compound.

[5] The pressure sensitive adhesive tape for semiconductor processing according to [4], wherein the energy ray polymerizable compound includes a urethane (meth)acrylate-based oligomer and a polyfunctional polymerizable compound.

[6] The pressure sensitive adhesive tape for semiconductor processing according to any one of [1] to [3], wherein the buffer layer is a layer containing a polyolefin resin film.

[7] The pressure sensitive adhesive tape for semiconductor processing according to any one of [1] to [6], wherein the pressure sensitive adhesive layer has a thickness of less than 100 μm.

[8] A method for producing a semiconductor device including steps of:

adhering the pressure sensitive adhesive tape for semiconductor processing according to any one of [1] to [7] above, to a front surface of a semiconductor wafer;

forming a modified region inside the semiconductor wafer from the front surface or a back surface of the semiconductor wafer;

dicing the semiconductor wafer, of which the pressure sensitive adhesive tape is adhered to the front surface and the modified region is formed, using the modified region as a starting point for forming a plurality of chips by grinding the semiconductor wafer from the back surface; and releasing the pressure sensitive adhesive tape from the plurality of chips.

In the first embodiment of the present invention, the pressure sensitive adhesive tape means a laminate including a base, a buffer layer provided on at least one surface of the base, and a pressure sensitive adhesive layer provided on the other surface of the base. Furthermore, the pressure sensitive adhesive tape does not exclude inclusion of constituent layers other than these constituent layers. For example, a primer layer may be formed on the surface of the base on a side of the pressure sensitive adhesive layer, and a release sheet for protecting the pressure sensitive adhesive layer until use may be laminated on the surface of the pressure sensitive adhesive layer. In addition, the base may be single layered or multiple layered. The same applies to the buffer layer and the pressure sensitive adhesive layer.

The configuration of respective members of the pressure sensitive adhesive tape for semiconductor processing according to the first embodiment will now be described in further detail.

[Base]

The base has a Young's modulus of 1000 MPa or more at 23° C. If a base having a Young's modulus of less than 1000 MPa is used, the retaining capability of the pressure sensitive adhesive tape is reduced with respect to a semiconductor wafer or semiconductor chips, and it is therefore impossible to suppress, for example, vibrations at the time of back side grinding and chipping or breakage of semiconductor chips is likely to occur. Meanwhile, by setting the base has a Young's modulus of 1000 MPa or more at 23° C., the retaining capability of the pressure sensitive adhesive tape is increased with respect to the semiconductor wafer or semiconductor chips, and it is thereby possible to suppress, for example, vibrations at the time of back side grinding to prevent chipping or breakage of the semiconductor chips. In addition, it is possible to reduce a stress applied when the pressure sensitive adhesive tape is released from semiconductor chips to prevent chipping or breakage of the chips at the time of releasing the tape. Moreover, the workability can also be improved at the time of adhering the pressure sensitive adhesive tape to the semiconductor wafer. In view of the foregoing, the Young's modulus of the base at 23° C. is preferably 1800 to 30000 MPa, and more preferably 2500 to 6000 MPa.

The thickness of the base is not particularly limited, but is preferably 110 μm or less, more preferably 15 to 110 μm, and still more preferably 20 to 105 μm. By setting the thickness of the base to be 110 μm or less, it is easy to control the releasing force of the pressure sensitive adhesive tape. By setting the thickness 15 μm or more, the base easily functions as a support of the pressure sensitive adhesive tape.

The material of the base is not particularly limited as long as the material satisfies the above-mentioned physical properties, and various resin films can be used. Here, as the base having a Young's modulus of 1000 MPa or more at 23° C., there listed, for example, resin films of polyethylene terephthalate, polyethylene naphthalate, polybutylene terephthalate, polyester such as wholly aromatic polyester, polyimide, polyamide, polycarbonate, polyacetal, modified-polyphenyleneoxide, polyphenylene sulfide, polysulfone, polyether ketone, and biaxially oriented polypropylene.

Among these resin films, a film containing at least one selected from a polyester film, a polyamide film, a polyimide film, and a biaxially oriented polypropylene film is preferable, a film containing a polyester film is more preferable, and a film containing a polyethylene terephthalate film is still more preferable.

The base may contain, for example, a plasticizer, a lubricant, an infrared absorber, an ultraviolet absorber, a filler, a colorant, an antistatic agent, an antioxidant, or a catalyst, as long as the effects of the present invention would not be impaired. The base may be transparent or opaque, and may be colored or vapor-deposited as desired.

At least one surface of the base may be subjected to an adhesion treatment such as a corona treatment in order to improve adhesion with at least one of the buffer layer and the pressure sensitive adhesive layer. The base may include the above-mentioned resin film and an easy-adhesion layer with which at least one of the surfaces of the resin film is coated.

The composition for forming an easy-adhesion layer that is used to form the easy-adhesion layer is not particularly limited, but is, for example, a composition containing a polyester-based resin, a urethane-based resin, a polyester-urethane-based resin, an acrylic resin or the like. The composition for forming the easy-adhesion layer may contain a crosslinking agent, a photopolymerization initiator, an antioxidant, a softener (plasticizer), a filler, a rust inhibitor, a pigment, a dye or the like, as required.

The easy-adhesion layer has a thickness of preferably 0.01 to 10 μm and more preferably 0.03 to 5 μm. Since the thickness of the easy-adhesion layer of examples of the present application is small with respect to the thickness of the base, and thus the thickness of the resin film having the easy-adhesion layer and the thickness of the base are substantially identical. In addition, the material of the easy-adhesion layer is soft, the Young's modulus is less affected, and thus the Young's modulus of the base is substantially identical to the Young's modulus of the resin film even when the pressure sensitive adhesive tape includes the easy-adhesion layer.

For example, the Young's modulus of the base can be controlled by, for example, selection of the resin composition, addition of a plasticizer, conditions for stretching at the time of producing the resin film. Specifically, in a case in which a polyethylene terephthalate film is used as the base, the Young's modulus of the base tends to be lower if the content ratio of the ethylene component in the copolymerization component is higher. The Young's modulus of the base tends to be lower if the amount of the plasticizer is greater with respect to the resin composition constituting the base.

[Buffer Layer]

The buffer layer is a softer layer compared to the base, and reduces a stress at the time of grinding the back surface of a semiconductor wafer to prevent cracking and chipping of the semiconductor wafer. The semiconductor wafer to which the pressure sensitive adhesive tape is adhered is placed on a vacuum table with the pressure sensitive adhesive tape in between at the time of back side grinding, and by providing the buffer layer as a constituent layer of the pressure sensitive adhesive tape, the semiconductor wafer is easily retained on the vacuum table.

The buffer layer has a tensile storage elastic modulus ($E_{23}$) of 100 to 2000 MPa at 23° C., and a tensile storage elastic modulus of 20 to 1000 MPa at 60° C. The pressure sensitive adhesive tape may be adhered to the semiconductor wafer at around a normal temperature (23° C.). In addition, the pressure sensitive adhesive tape may be heated from a temperature around 23° C. to about 60 to 90° C. due to frictional heat at the time of back side grinding. If the tensile storage elastic modulus ($E_{23}$) of the buffer layer at a normal temperature (23° C.) is less than 100 MPa or the tensile storage elastic modulus ($E_{60}$) at 60° C. is less than 20 MPa, the pressure sensitive adhesive tape is deformed due to a stress at the time of back side grinding and the chips retained on the pressure sensitive adhesive tape are displaced, which results in collision of the chips with one another and occurrence of cracks in the chips. Meanwhile, if the tensile storage elastic modulus ($E_{23}$) of the buffer layer at the normal temperature (23° C.) is more than 2000 MPa or if the tensile storage elastic modulus ($E_{60}$) at 60° C. is more than 1000 MPa, the stress at the time of the back side grinding cannot be sufficiently relaxed, which results in collision of the chips with one another due to, for example, warping of the pressure sensitive adhesive tape, and occurrence of cracks in the chips.

With the tensile storage elastic modulus ($E_{23}$) and the tensile storage elastic modulus ($E_{60}$) within the above-mentioned ranges, it is possible to prevent deformation of the pressure sensitive adhesive tape due to a stress at the time of back side grinding and to maintain an appropriate buffer capability, thereby suppressing cracks of the chips. In addition, by setting the tensile storage elastic modulus ($E_{23}$) within the above-mentioned range, the adhesion between the pressure sensitive adhesive tape and the vacuum table is improved, and vibrations at the time of back side grinding can be suppressed. Moreover, the pressure sensitive adhesive tape can be easily released after back side grinding.

In view of the foregoing, the tensile storage elastic modulus ($E_{23}$) of the buffer layer at 23° C. is preferably 100 to 2000 MPa, more preferably 150 to 1000 MPa, and still more preferably 200 to 700 MPa. The tensile storage elastic modulus ($E_{60}$) of the buffer layer at 60° C. is preferably 20 to 1000 MPa, more preferably 30 to 300 MPa, and still more preferably 40 to 200 MPa. Moreover, the tensile storage elastic modulus ($E_{90}$) of the buffer layer at 90° C. is preferably 0.1 to 300 MPa, more preferably 5 to 100 MPa, and still more preferably 10 to 50 MPa.

It is preferable that the tensile storage elastic modulus ($E_{23}$) of the buffer layer at 23° C. and the tensile storage elastic modulus ($E_{60}$) of the buffer layer at 60° C. satisfy ($E_{23}$)/($E_{60}$)≤90.

In addition, it is preferable that the tensile storage elastic modulus ($E_{23}$) of the buffer layer at 23° C. and the tensile storage elastic modulus ($E_{90}$) of the buffer layer at 90° C. satisfy ($E_{23}$)/($E_{90}$)≤90.

The ratio [($E_{23}$)/($E_{60}$)] between the tensile storage elastic modulus ($E_{23}$) and the tensile storage elastic modulus ($E_{60}$) is an index of the transition in the tensile storage elastic modulus from 23° C. to 60° C., and the ratio [($E_{23}$)/($E_{90}$)] between the tensile storage elastic modulus ($E_{23}$) and the tensile storage elastic modulus ($E_{90}$) is an index of the transition in the tensile storage elastic modulus from 23° C. to 90° C. In general, when the temperature rises, the tensile storage elastic modulus of the buffer layer decreases, and a smaller ($E_{23}$)/($E_{60}$) and ($E_{23}$)/($E_{90}$) mean that the temperature dependence of the tensile storage elastic modulus is lower.

By setting the ratio between the tensile storage elastic modulus ($E_{23}$) and the tensile storage elastic modulus ($E_{60}$) or the ratio between the tensile storage elastic modulus ($E_{23}$) and the tensile storage elastic modulus ($E_{90}$) to be within the above-mentioned range, it is possible to reduce a change in physical properties of the buffer layer with respect to the temperature change due to the frictional heat during back side grinding.

As a result, it is possible to prevent deformation of the pressure sensitive adhesive tape due to a stress at the time of back side grinding in the above-mentioned temperature region, and to maintain an appropriate buffer capability, thereby suppressing cracks of the chips.

In view of the foregoing, it is more preferable that ($E_{23}$)/($E_{60}$)≤33, and still more preferably 1≤($E_{23}$)/($E_{60}$)≤18. In addition, it is more preferable that ($E_{23}$)/($E_{90}$)≤70, and still more preferably 4≤($E_{23}$)/($E_{90}$)≤50.

It is preferable that the maximum value of tan δ of the dynamic viscoelasticity of the buffer layer at −5 to 120° C. (which may also be simply referred to as "maximum value of tan δ" in the following description) is 1.0 or less. If the maximum value of tan δ of the buffer layer exceeds 1.0, the buffer layer may be significantly deformed due to a stress at the time of back side grinding, and the chips retained on the pressure sensitive adhesive tape may be thereby displaced, which may result in collision of the chips with one another and occurrence of cracks in the chips. In view of the foregoing, the maximum value of tan δ of the buffer layer is more preferably 0.5 or less, and still more preferably 0.05 to 0.5.

Tan δ is referred to as a loss tangent which is defined by "tensile loss elastic modulus/tensile storage elastic modulus" and is a value measured by a response to a stress, such as a tensile stress or a torsional stress, applied to an object by a dynamic viscoelasticity measuring apparatus.

The gel fraction of the buffer layer is preferably 70 to 99%, and more preferably 90 to 99%. By setting the gel fraction of the buffer layer within the above-mentioned range, it is possible to suppress deformation of the buffer layer due to a stress at the time of back side grinding.

In a case in which the buffer layer is formed of a buffer layer-forming composition that contains an energy ray polymerizable compound, it is acceptable as long as one of the gel fraction before energy ray curing and the gel fraction after energy ray curing is within the above-mentioned range.

The gel fraction of the buffer layer can be measured by the following method.

The buffer layer having a thickness of 20 μm is cut into a size of 50 mm by 100 mm to be prepared as a measurement sample. The measurement sample is wrapped in a 100 mm by 150 mm sized nylon mesh (mesh size 200), a mass of the measurement sample and the nylon mesh is weighed in a precision balance, and the mass of the nylon mesh measured in advance is subtracted from the mass obtained by weighing to obtain the mass of the measurement sample only. The mass at this point is defined as M1.

Next, the measurement sample wrapped in the above-mentioned nylon mesh is immersed in 100 mL of ethyl acetate at 25° C. for 24 hours. Then, the measurement sample is taken out and dried for 1 hour at 120° C., and thereafter left for 1 hour under a condition in which the temperature is 23° C. and the relative humidity is 50% to adjust the humidity. The mass of the measurement sample and the nylon mesh at this stage is weighed in the precision balance, and the mass of the nylon mesh measured in advance is subtracted from the mass obtained by weighing to obtain the mass of the measurement sample only. The mass at this point is defined as M2. The gel fraction (%) can be calculated by the equation below.

$$\text{The gel fraction (\%)}=(M2/M1)\times 100$$

The thickness of the buffer layer is preferably 1 to 100 μm, more preferably 5 to 80 μm, and still more preferably 10 to 60 μm. By setting the thickness of the buffer layer within the above-mentioned range, it is possible that the buffer layer appropriately relaxes a stress at the time of back side grinding.

The buffer layer is preferably a layer formed of a buffer layer-forming composition that contains an energy ray polymerizable compound, or a layer containing a polyolefin resin film.

Descriptions will now be given for respective components contained in the layer formed of the buffer layer-forming composition that contains an energy ray polymerizable compound and respective components contained in the layer containing a polyolefin resin film in this order.

<Layer Formed of the Buffer Layer-Forming Composition that Contains the Energy Ray Polymerizable Compound>

The buffer layer-forming composition that contains an energy ray polymerizable compound can be cured by irradiation with energy ray. The term "energy ray" refers to, for example, ultraviolet rays or electron ray, and ultraviolet rays are preferably used.

More specifically, the buffer layer-forming composition that contains an energy ray polymerizable compound preferably contains a urethane (meth)acrylate (a1) and a polyfunctional polymerizable compound (a2).

If the buffer layer-forming composition contains these two components, it is easy to define the tensile storage elastic modulus ($E_{23}$, $E_{60}$ and $E_{90}$) and the maximum value of tan δ of the buffer layer within the above-mentioned ranges. In view of the foregoing, it is more preferable that the buffer layer-forming composition contains, in addition to the above-mentioned components (a1) and (a2), a polymerizable compound (a3) having an alicyclic group or a heterocyclic group having 6 to 20 ring atoms and/or a polymerizable compound (a4) having a functional group. The buffer layer-forming composition more preferably contains, in addition to the above-mentioned components (a1) to (a4), a photopolymerization initiator, and may contain other additives or resin components as long as the effects of the present invention would not be impaired.

Descriptions will now be given for respective components contained in the buffer layer-forming composition that contains an energy ray polymerizable compound.

(Urethane (meth)acrylate (a1))

The urethane (meth)acrylate (a1) is a compound having at least a (meth)acryloyl group and urethane bonds, and has a property of being polymerized and cured by irradiation with energy ray. The urethane (meth)acrylate (a1) is an oligomer or a polymer.

The weight average molecular weight (Mw) of the component (a1) is preferably 1000 to 100000, more preferably 2000 to 60000, and still more preferably 3000 to 20000.

The number of (meth)acryloyl group (which may also be referred to as "number of functional group" in the following description) in the component (a1) may be monofunctional, bifunctional, or trifunctional or greater, but is preferably monofunctional or bifunctional.

The component (a1) can be obtained by, for example, reacting a polyol compound with a polyvalent isocyanate compound and thereby obtaining a terminal isocyanate urethane prepolymer with which a (meth)acrylate having a hydroxyl group is reacted. One kind of the component (a1) may be used by itself, or two or more kinds may be combined for use.

The polyol compound as a material of the component (a1) is not particularly limited as long as it is a compound having two or more hydroxy groups. Specific examples of the polyol compound include an alkylene diol, a polyether type polyol, a polyester type polyol, and a polycarbonate type polyol. Among these, a polyester type polyol or a polycarbonate type polyol is preferable.

The polyol compound may be any one of a bifunctional diol, a trifunctional triol, and a tetrafunctional polyol or greater, and a bifunctional diol is preferable, and a polyester type diol or a polycarbonate type diol is more preferable.

Examples of the polyvalent isocyanate compound include aliphatic polyisocyanates such as tetramethylene diisocyanate, hexamethylene diisocyanate, and trimethylhexamethylene diisocyanate; alicyclic diisocyanates such as isophorone diisocyanate, norbornane diisocyanate, dicyclohexylmethane-4,4'-diisocyanate, dicyclohexylmethane-2,4'-diisocyanate, and ω-ω'-diisocyanate dimethylcyclohexane; and aromatic diisocyanates such as 4,4'-diphenylmethane diisocyanate, tolylene diisocyanate, xylylene diisocyanate, tolidine diisocyanate, tetramethylene xylylene diisocyanate, and naphthalene-1,5-diisocyanate.

Among these, isophorone diisocyanate, hexamethylene diisocyanate, and xylylene diisocyanate are preferable.

A urethane (meth)acrylate (a1) can be obtained by reacting, with a (meth)acrylate having a hydroxyl group, a terminal isocyanate urethane prepolymer obtained from the reaction of the above-mentioned polyol compound and a polyvalent isocyanate compound. The (meth)acrylate having a hydroxy group is not particularly limited as long as it is a compound having at least a hydroxy group and a (meth)acryloyl group in one molecule.

Specific examples of the (meth)acrylate having a hydroxy group include hydroxyalkyl (meth)acrylates such as 2-hydroxyethyl (meth)acrylate, 2-hydroxypropyl (meth)acrylate, 4-hydroxybutyl (meth)acrylate, 4-hydroxycyclohexyl (meth)acrylate, 5-hydroxycyclooctyl (meth)acrylate, 2-hydroxy-3-phenyloxypropyl (meth)acrylate, pentaerythritol tri (meth)acrylate, polyethylene glycol mono(meth)acrylate, and polypropylene glycol mono(meth)acrylate; hydroxy group-containing (meth)acrylamides such as N-methylol (meth)acrylamide; and a reaction product obtained by reacting (meth)acrylic acid with a diglycidyl ester of vinyl alcohol, vinyl phenol and bisphenol A.

Among these, hydroxyalkyl (meth)acrylate is preferable, and 2-hydroxyethyl (meth)acrylate is more preferable.

It is preferable that a condition for the reaction of the terminal isocyanate urethane prepolymer and the (meth)acrylate having a hydroxy group is such that the reaction is carried out at 60 to 100° C. for 1 to 4 hours in the presence of a solvent or a catalyst added as required.

The content of the component (a1) in the buffer layer-forming composition is preferably 10 to 70% by mass, more preferably 20 to 60% by mass, still more preferably 25 to 55% by mass, and particularly preferably 30 to 50% by mass with respect to the total amount (100% by mass) of the buffer layer-forming composition.

(Polyfunctional Polymerizable Compound (a2))

The polyfunctional polymerizable compound refers to a compound having two or more photopolymerizable unsaturated groups. A photopolymerizable unsaturated group is a functional group containing a carbon-carbon double bond, and examples thereof include a (meth)acryloyl group, a vinyl group, an allyl group, and a vinylbenzyl group. Two or more kinds of photopolymerizable unsaturated groups may be used in combination. A three-dimensional network structure (crosslinked structure) is formed by a reaction between the photopolymerizable unsaturated group in the polyfunctional polymerizable compound and the (meth)acryloyl group in the component (a1), or a reaction of the photopolymerizable unsaturated groups in the component (a2) with one another. If a polyfunctional polymerizable compound is used, the crosslinked structure formed by energy ray irradiation increases as compared to a case in which a compound containing only one photopolymerizable unsaturated group is used, so that the buffer layer exhibits a specific viscoelasticity, and thus it is easy to control the tensile storage elastic modulus ($E_{23}$, $E_{60}$, and $E_{90}$) and the maximum value of tan δ within the above-mentioned ranges.

Although the definition of the component (a2), and the definition of the component (a3) and the component (a4) that will be described later overlap, the overlapping part is included in the component (a2). For example, a compound having an alicyclic group or a heterocyclic group having 6 to 20 ring-forming atoms and having two or more (meth)acryloyl groups is included in the definitions of both the component (a2) and the component (a3), but it is defined in the present invention that the compound is included in the component (a2). In addition, although a compound containing a functional group such as a hydroxyl group, an epoxy group, an amide group or an amino group and having two or more (meth)acryloyl groups is included in the definition of both the component (a2) and the component (a4), it is defined in the present invention that the compound is included in the component (a2).

In view of the foregoing, the number (the number of functional groups) of the photopolymerizable unsaturated groups in the polyfunctional polymerizable compound is preferably 2 to 10, and more preferably 3 to 6.

The weight average molecular weight of the component (a2) is preferably 30 to 40000, more preferably 100 to 10000, and still more preferably 200 to 1000.

Specific examples of the component (a2) include diethylene glycol di(meth)acrylate, ethylene glycol di(meth)acrylate, tetraethylene glycol di(meth)acrylate, neopentyl glycol di(meth)acrylate, 1,6-hexanediol di(meth)acrylate, trimethylolpropane tri(meth)acrylate, pentaerythritol tri(meth)acrylate, pentaerythritol tetra(meth)acrylate, dipentaerythritol hexa(meth)acrylate, divinyl benzene, vinyl (meth)acrylate, divinyl adipate, and N, N'-methylenebis(meth)acrylamide.

One kind of the component (a2) may be used by itself, or two or more kinds may be combined for use.

Among these, dipentaerythritol hexa(meth) acrylate is preferable.

The content of the component (a2) in the buffer layer-forming composition is preferably 2 to 40% by mass, more preferably 3 to 20% by mass, and still more preferably 5 to 15% by mass with respect to the total amount (100% by mass) of the buffer layer-forming composition.

(Polymerizable Compound (a3) Having an Alicyclic Group or a Heterocyclic Group Having 6 to 20 Ring-Forming Atoms)

The component (a3) is a polymerizable compound having an alicyclic group or a heterocyclic group having 6 to 20 ring-forming atoms, more preferably a compound having at least one (meth)acryloyl group, and more preferably a compound having one (meth)acryloyl group. With the component (a3), it is possible to improve the film-forming capability of the buffer layer-forming composition to be obtained.

Although the definition of the component (a3) and the definition of the component (a4) which will be described later overlap each other, the overlapping part is included in the component (a4). For example, a compound having at least one (meth)acryloyl group, an alicyclic group or a heterocyclic group having 6 to 20 ring-forming atoms, a functional group such as a hydroxyl group, an epoxy group, an amide group, or an amino group is included in the definitions of both the component (a3) and the component (a4), but the compound is included in the component (a4) in the present invention.

The number of ring-forming atoms of the alicyclic group or heterocyclic group contained in the component (a3) is preferably 6 to 20, more preferably 6 to 18, still more preferably 6 to 16, and particularly preferably 7 to 12. Examples of the atom forming the ring structure of the heterocyclic group include a carbon atom, a nitrogen atom, an oxygen atom, and a sulfur atom.

The number of ring-forming atoms represents the number of atoms constituting the ring itself of a compound having a structure in which an atom is bonded in a ring, and the number of ring-forming atoms does not include an atom which is not an constituent of the ring (for example, a hydrogen atom bonded to an atom constituting the ring) or an atom included in a substituent when the ring is substituted by the substituent.

Specific examples of the component (a3) include alicyclic group-containing (meth)acrylates such as isobornyl (meth)acrylate, dicyclopentenyl (meth)acrylate, dicyclopentanyl (meth)acrylate, dicyclopentenyloxy (meth)acrylate, cyclohexyl (meth)acrylate, and adamantane (meth)acrylate; and heterocyclic group-containing (meth)acrylates such as tetrahydrofurfuryl (meth)acrylate and morpholine (meth)acrylate.

One kind of the component (a3) may be used by itself, or two or more kinds may be combined for use.

Among the alicyclic group-containing (meth)acrylates, isobornyl (meth)acrylate is preferable, and tetrahydrofurfuryl (meth)acrylate is preferable among the heterocyclic group-containing (meth)acrylates.

The content of the component (a3) in the buffer layer-forming composition is preferably 10 to 70% by mass, more preferably 20 to 60% by mass, and still more preferably 25 to 55% by mass with respect to the total amount (100% by mass) of the buffer layer-forming composition.

In addition, the content ratio [(a2)/(a3)] of the component (a2) and the component (a3) in the buffer layer-forming composition is preferably 0.1 to 3.0, more preferably 0.15 to 2.0, still more preferably 0.18 to 1.0, and particularly preferably 0.2 to 0.5.

(Polymerizable Compound (a4) Having a Functional Group)

The component (a4) is a polymerizable compound containing a functional group such as a hydroxyl group, an epoxy group, an amide group, or an amino group, and is preferably a compound having at least one (meth)acryloyl group, more preferably a compound having one (meth) acryloyl group.

The component (a4) has a good compatibility with the component (a1), and it is easy to adjust the viscosity of the buffer layer-forming composition within an appropriate range. In addition, it is easy to define the tensile storage elastic modulus ($E_{23}$, $E_{60}$ and $E_{90}$) and the maximum value of tan δ of the buffer layer formed of the composition within the above-mentioned range, and the buffer capability is improved even if the buffer layer is made relatively thin.

Examples of the component (a4) include a hydroxyl group-containing (meth)acrylate, an epoxy group-containing compound, an amide group-containing compound, and an amino group-containing (meth)acrylate.

Examples of the hydroxyl group-containing (meth)acrylate include 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, phenylhydroxypropyl (meth)acrylate, 2-hydroxy-3-phenoxypropyl acrylate.

Examples of the epoxy group-containing compound include glycidyl (meth)acrylate, methylglycidyl (meth)acrylate, allyl glycidyl ether, and among these, epoxy group-containing (meth)acrylates such as glycidyl (meth)acrylate and methylglycidyl (meth)acrylate are preferable.

Examples of the amide group-containing compound include (meth)acrylamide, N, N'-dimethyl (meth)acrylamide, N-butyl (meth)acrylamide, N-methylol (meth)acrylamide, N-methylopropane (meth)acrylamide, N-methoxymethyl (meth)acrylamide, and N-butoxymethyl (meth)acrylamide.

Examples of the amino group-containing (meth)acrylate include primary amino group-containing (meth)acrylate, secondary amino group-containing (meth)acrylate, and tertiary amino group-containing (meth)acrylate.

Among these, a hydroxyl group-containing (meth)acrylate is preferable, and a hydroxyl group-containing (meth) acrylate having an aromatic ring such as phenylhydroxypropyl (meth)acrylate is more preferable.

One kind of the component (a4) may be used by itself, or two or more kinds may be combined for use.

The content of the component (a4) in the buffer layer-forming composition is preferably 5 to 40% by mass, more preferably 7 to 35% by mass, still more preferably 10 to 30% by mass, and particularly preferably 13 to 25% by mass with respect to the total amount (100% by mass) of the buffer layer-forming composition in order to easily define the tensile storage elastic modulus ($E_{23}$, $E_{60}$ and $E_{90}$) and the maximum value of tan δ of the buffer layer within the above-mentioned range and to improve the film-forming capability of the buffer-layer forming composition.

The content ratio [(a3)/(a4)] of the component (a3) and the component (a4) in the buffer layer-forming composition is preferably 0.5 to 3.0, more preferably 1.0 to 3.0, still more preferably 1.3 to 3.0, and particularly preferably 1.5 to 2.8.
(Polymerizable Compound (a5) Other than Components (a1) to (a4))

The buffer layer-forming composition may contain polymerizable compounds (a5) other than the above-mentioned components (a1) to (a4) as long as the effects of the present invention would not be impaired.

Examples of the component (a5) include alkyl (meth) acrylates having an alkyl group having 1 to 20 carbon atoms; and vinyl compounds such as styrene, hydroxyethyl vinyl ether, hydroxybutyl vinyl ether, N-vinylformamide, N-vinylpyrrolidone, and N-vinylcaprolactam. One kind of the component (a5) may be used by itself, or two or more kinds may be combined for use.

The content of the component (a5) in the buffer layer-forming composition is preferably 0 to 20% by mass, more preferably 0 to 10% by mass, still more preferably 0 to 5% by mass, and particularly preferably 0 to 2% by mass.
(Photopolymerization Initiator)

When the buffer layer is formed, it is preferable that the buffer layer-forming composition further contains a photopolymerization initiator in view of reductions in polymerization time with light irradiation and in the amount of light irradiation.

Examples of the photopolymerization initiator include benzoin compounds, acetophenone compounds, acylphosphine oxide compounds, titanocene compounds, thioxanthone compounds, peroxide compounds, and further include photosensitizers such as amines and quinones, and more specific examples include 1-hydroxycyclohexyl phenyl ketone, 2-hydroxy-2-methyl-1-phenyl-propan-1-one, benzoin, benzoin methyl ether, benzoin ethyl ether, benzoin isopropyl ether, benzylphenyl sulfide, tetramethylthiuram monosulfide, azobisisobutyrol nitrile, dibenzyl, diacetyl, 8-chloranthraquinone, bis (2,4,6-trimethylbenzoyl) phenylphosphine oxide.

One of these photopolymerization initiators may be used by itself, or two or more thereof may be combined for use.

The content of the photopolymerization initiator in the buffer layer-forming composition is preferably 0.05 to 15 parts by mass, more preferably 0.1 to 10 parts by mass, and still more preferably 0.3 to 5 parts by mass with respect to 100 parts by mass of the total amount of the energy ray polymerizable compound.
(Other Additives)

The buffer layer-forming composition may contain other additives as long as the effects of the present invention would not be impaired. Examples of the other additives include an antistatic agent, an antioxidant, a softener (plasticizer), a filler, a rust inhibitor, a pigment, and a dye. When these additives are combined, the content of each additive in the buffer layer-forming composition is preferably 0.01 to 6 parts by mass, more preferably 0.1 to 3 parts by mass with respect to 100 parts by mass of the total amount of the energy ray polymerizable compound.
(Resin Component)

The buffer layer-forming composition may contain a resin component as long as the effects of the present invention would not be impaired. Examples of the resin component include a polyene-thiol-based resin, a polyolefin-based resin such as polybutene, polybutadiene, and polymethylpentene, and a thermoplastic resin such as a styrene-based copolymer.

The content of these resin components in the buffer layer-forming composition is preferably 0 to 20% by mass, more preferably 0 to 10% by mass, still more preferably 0 to 5% by mass, and particularly preferably 0 to 2% by mass.

The buffer layer formed of the buffer layer-forming composition that contains the energy ray polymerizable compound is obtained by polymerizing and curing the buffer layer-forming composition having the above-mentioned composition by irradiation with energy ray. That is, the buffer layer is a cured product of the buffer layer-forming composition.

Thus, the buffer layer contains a polymerization unit derived from the component (a1) and a polymerization unit derived from the component (a2). In addition, the buffer layer preferably contains a polymerization unit derived from the component (a3) and/or a polymerization unit derived from the component (a4), and may contain a polymerization unit derived from the component (a5). The content ratio of each polymerization unit in the buffer layer typically coincides with the ratio (feed ratio) of each component constituting the buffer layer-forming composition. For example, in a case in which the content of the component (a1) in the buffer layer-forming composition is 10 to 70% by mass with respect to the total amount (100% by mass) of the buffer layer-forming composition, the buffer layer contains 10 to 70% by mass of the polymerization unit derived from the component (a1). In addition, in a case in which the content of the component (a2) in the buffer layer-forming composition is 2 to 40% by mass with respect to the total amount (100% by mass) of the buffer layer-forming composition, the buffer layer contains 2 to 40% by mass of the polymerization unit derived from the component (a2). The same applies to the components (a3) to (a5).
<Layer Containing a Polyolefin Resin Film>

By setting the buffer layer to be formed of a layer containing a polyolefin resin film, it is easy to define the tensile storage elastic modulus ($E_{23}$, $E_{60}$ and $E_{90}$) and the maximum value of tan δ of the buffer layer within the above-mentioned ranges.

In a case in which the buffer layer is a layer containing a polyolefin resin film, the stress relaxation property may be lower than that in a case in which the buffer layer is a layer formed of a buffer layer-forming composition that contains an energy ray polymerizable compound. In this case, warpage may occur in the pressure sensitive adhesive tape having the buffer layer formed of the layer containing the polyolefin resin film on one surface of the base. Although it is acceptable that the buffer layer formed of the layer containing the polyolefin resin film is provided on at least one surface of the base, it is preferable that, in view of preventing such a problem, the buffer layer formed of the layer containing the polyolefin resin film is provided on both surfaces of the base.

The polyolefin resin is not limited to specific kinds and examples thereof include a polyethylene resin such as very low density polyethylene (VLDPE, density: 880 kg/m$^3$ or more, less than 910 kg/m$^3$), low density polyethylene (LDPE, density: 910 kg/m$^3$ or more, less than 930 kg/m$^3$), medium density polyethylene (MDPE, density: 930 kg/m$^3$ or more, less than 942 kg/m$^3$), and high density polyethylene (HDPE, density: 942 kg/m$^3$ or more), a polypropylene resin, a polyethylene-polypropylene copolymer, an olefin-based elastomer (TPO), a cycloolefin resin, an ethylene-vinyl acetate copolymer (EVA), an ethylene-vinyl acetate maleic anhydride copolymer, an ethylene-(meth)acrylic acid copolymer, an ethylene-(meth)acrylic acid ester copolymer, an ethylene-(meth)acrylic acid ester-maleic anhydride copolymer.

These polyolefin resins may be used by itself, or two or more thereof may be combined for use.

Among the above-mentioned polyolefin resins, a polyethylene resin is preferable, and a low-density polyethylene is more preferable in view of obtaining the buffer layer having specific physical properties.

The buffer layer may contain a plasticizer, a lubricant, an infrared absorber, an ultraviolet absorber, a filler, a colorant, an antistatic agent, an antioxidant, a catalyst, and the like as long as the effects of the present invention would not be impaired. In addition, the buffer layer described above may be transparent or opaque, and may be colored or vapor-deposited as desired.

For example, it is possible to control the tensile storage elastic modulus ($E_{23}$, $E_{60}$ and $E_{90}$), ($E_{23}$)/($E_{60}$) and ($E_{23}$)/($E_{90}$) of the buffer layer with the composition of the component (a1), the weight average molecular weight of the component (a1), and the amount of components (a2) to (a3). Specifically, if a polyester type polyol or a polycarbonate type polyol is selected as the polyol compound, the tensile storage elastic modulus of the buffer layer tends to decrease. If a diol or triol is selected as the polyol compound, the tensile storage elastic modulus of the buffer layer tends to decrease. If the weight average molecular weight of the component (a1) is reduced, the tensile storage elastic modulus of the buffer layer tends to decrease. If the content of the component (a2) is increased, the tensile storage elastic modulus of the buffer layer tends to increase. If the content of the component (a3) is increased, the tensile storage elastic modulus of the buffer layer tends to slightly decrease. If the content of the component (a4) is increased, the tensile storage elastic modulus of the buffer layer tends to slightly decrease.

The maximum value of tan δ of the buffer layer tends to increase as the content of the component (a1) is increased. Meanwhile, if the contents of the component (a2) to (a4), and particularly the content of the component (a2), are increased, the maximum value of tan δ of the buffer layer tends to decrease.

The gel fraction of the buffer layer tends to decrease if the content of the components (a2) to (a4) are small. In particular, if the content of the component (a2) is small, the gel fraction of the buffer layer may greatly decrease.

[Pressure Sensitive Adhesive Layer]

Although the pressure sensitive adhesive layer is not particularly limited as long as it has an appropriate pressure-sensitive adhesiveness at a normal temperature, the pressure sensitive adhesive layer preferably has a shear storage elastic modulus of 0.05 to 0.50 MPa at 23° C. A surface of a semiconductor wafer has circuits, for example, formed thereon, and is typically uneven. If the shear storage elastic modulus of the pressure sensitive adhesive layer is within the above-mentioned range, when the pressure sensitive adhesive tape is adhered to the uneven surface of the wafer, it is possible that the unevenness of the surface of the wafer and the pressure sensitive adhesive layer are adequately brought into contact with each other, and the adhesiveness of the pressure sensitive adhesive layer is appropriately exhibited. It is therefore possible to reliably fix the pressure sensitive adhesive tape to the semiconductor wafer, and to appropriately protect the wafer surface at the time of back side grinding. In view of the foregoing, the shear storage elastic modulus of the pressure sensitive adhesive layer is more preferably 0.12 to 0.35 MPa. The shear storage elastic modulus of the pressure sensitive adhesive layer means the shear storage elastic modulus before curing by irradiation with energy ray in a case in which the pressure sensitive adhesive layer is formed of an energy ray curable adhesive.

The shear storage elastic modulus can be measured by the following method. A pressure sensitive adhesive layer having a thickness of approximately 0.5 to 1 mm is punched into a circular shape having a diameter of 7.9 mm, and is prepared as a measurement sample. Using a dynamic viscoelasticity measuring apparatus ARES manufactured by Rheometric Scientific Ltd., the elastic modulus of the measurement sample is measured where a temperature range of −30° C. to 150° C. is changed at a temperature increase rate of 3° C./min at a frequency of 1 Hz. The elastic modulus at the measurement temperature of 23° C. is defined as the shear storage elastic modulus at 23° C.

The thickness of the pressure sensitive adhesive layer is preferably less than 100 μm, more preferably 5 to 80 μm, and still more preferably 10 to 70 μm. If such a thin pressure sensitive adhesive layer is made, it is possible to reduce the proportion of a portion having a low rigidity in the pressure sensitive adhesive tape, and thus it is easy to prevent chipping of semiconductor chips that occurs at the time of the back side grinding.

The pressure sensitive adhesive layer is formed of, for example, an acrylic-based adhesive, a urethane-based adhesive, a rubber-based adhesive, a silicone-based adhesive, and an acrylic-based adhesive is preferable.

In addition, the pressure sensitive adhesive layer is preferably formed of an energy ray curable adhesive. With the pressure sensitive adhesive layer formed of an energy ray curable adhesive, it is possible to set the shear storage elastic modulus at 23° C. within the above-mentioned range before curing by energy ray irradiation and to easily set the releasing force to 1000 mN/50 mm or less after curing.

Specific examples of the adhesive will now be described in detail, but these are non-limiting examples, and the pressure sensitive adhesive layer of the present invention should not be construed as being limited thereto.

As the energy ray curable adhesive, for example, in addition to a non-energy ray curable adhesive resin (also referred to as "adhesive resin I"), it is possible to use an energy ray curable adhesive composition containing an energy ray curable compound other than the adhesive resin (also referred to as an "X-type adhesive composition" in the following). In addition, as the energy ray curable adhesive, an adhesive composition (also referred to as "Y-type adhesive composition" in the following) may also be used, the adhesive composition containing, as a main constituent, an energy ray curable adhesive resin (also referred to as "adhesive resin II" in the following) having an unsaturated group introduced into a side chain of a non-energy ray curable adhesive resin, and the adhesive component containing no energy ray curable compound other than the adhesive resin.

Moreover, as the energy ray curable adhesive, a combination of an X-type and a Y-type may be used, that is, an energy ray curable adhesive composition (also referred to as an "XY-type adhesive composition" in the following) containing an energy ray curable compound other than an adhesive resin, in addition to the energy ray curable adhesive resin II.

Among these, an XY-type adhesive composition is preferably used. By using the XY-type, it is possible to have a sufficient pressure sensitive adhesive property before curing and to have an adequately low releasing force with respect to the semiconductor wafer after curing.

However, the adhesive may be formed of a non-energy ray curable adhesive composition which is not curable when irradiated with energy ray. The non-energy ray curable adhesive composition does not contain the above-mentioned energy ray curable adhesive resin II and the energy ray curable compound while containing at least the non-energy ray curable adhesive resin I.

In the following description, the term "adhesive resin" is used as a term referring to one or both of the above-mentioned adhesive resin I and the adhesive resin II. Specific examples of the adhesive resin include an acrylic-based resin, a urethane-based resin, a rubber-based resin, and a silicone-based resin, and an acrylic-based resin is preferable.

The following is a more detailed description of an acrylic-based adhesive in which the acrylic-based resin is used as the adhesive resin.

As the acrylic-based resin, an acrylic-based polymer (b) is used. The acrylic-based polymer (b) is obtained by polymerizing a monomer containing at least alkyl (meth)acrylate, and includes a structural unit derived from the alkyl (meth) acrylate. Examples of the alkyl (meth)acrylate include those having 1 to 20 carbon atoms of the alkyl group, and the alkyl group may be linear or branched. Specific examples of the alkyl (meth)acrylate include methyl (meth)acrylate, ethyl (meth)acrylate, isopropyl (meth)acrylate, n-propyl (meth) acrylate, n-butyl (meth)acrylate, 2-ethylhexyl (meth)acrylate, n-octyl (meth)acrylate, isooctyl (meth)acrylate, nonyl (meth)acrylate, decyl (meth)acrylate, undecyl (meth)acrylate, dodecyl (meth)acrylate.

One kind of the alkyl (meth)acrylates may be used by itself or two or more kinds may be combined for use.

In addition, the acrylic-based polymer (b) preferably contains a structural unit derived from an alkyl (meth) acrylate having 4 or more carbon atoms of an alkyl group in view of improving the pressure sensitive adhesive strength of the pressure sensitive adhesive layer. The alkyl (meth) acrylate preferably has 4 to 12 carbon atoms, and more preferably 4 to 6 carbon atoms. The alkyl (meth)acrylate having 4 or more carbon atoms of an alkyl group is preferably alkyl acrylate.

In the acrylic-based polymer (b), the alkyl (meth)acrylate having 4 or more carbon atoms of an alkyl group is preferably 40 to 98% by mass, more preferably 45 to 95% by mass, and still more preferably 50 to 90% by mass with respect to the total amount of the monomers constituting the acrylic-based polymer (b) (referred to simply as "total amount of the monomer" in the following description).

In order to adjust the modulus and the pressure sensitive adhesive property of the adhesive, it is preferable that the acrylic-based polymer (b) is a copolymer containing a structural unit derived from alkyl (meth)acrylate having 1 to 3 carbon atoms of an alkyl group, in addition to a structural unit derived from alkyl (meth)acrylate having 4 or more carbon atoms of an alkyl group. The alkyl (meth)acrylate is preferably alkyl (meth)acrylate having 1 or 2 carbon atoms, more preferably methyl (meth)acrylate, and most preferably methyl methacrylate. In the acrylic-based polymer (b), the alkyl (meth)acrylate having 1 to 3 carbon atoms of an alkyl group is preferably 1 to 30% by mass, more preferably 3 to 26% by mass, and still more preferably 6 to 22% by mass with respect to the total amount of the monomer.

The acrylic-based polymer (b) preferably has a structural unit derived from a functional group-containing monomer, in addition to the structural unit derived from the above-mentioned alkyl (meth)acrylate. Examples of the functional group of the functional group-containing monomer include a hydroxyl group, a carboxy group, an amino group, and an epoxy group. The functional group-containing monomer reacts with a crosslinking agent, which will be described later to cause crosslinking, or reacts with an unsaturated group-containing compound to introduce an unsaturated group to a side chain of the acrylic-based polymer (b).

Examples of the functional group-containing monomer include a hydroxyl group-containing monomer, a carboxy group-containing monomer, an amino group-containing monomer, and an epoxy group-containing monomer. One kind of these monomers may be used by itself or two or more kinds may be combined for use. Among these, a hydroxyl group-containing monomer and a carboxy group-containing monomer are preferable, and a hydroxyl group-containing monomer is more preferable.

Examples of the hydroxyl group-containing monomer include hydroxyalkyl (meth)acrylate such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth) acrylate; and unsaturated alcohols such as vinyl alcohol and allyl alcohol.

Examples of the carboxy group-containing monomer include an ethylenically unsaturated monocarboxylic acid such as a (meth)acrylic acid and a crotonic acid; and an ethylenically unsaturated dicarboxylic acid such as a fumaric acid, an itaconic acid, a maleic acid and a citraconic acid, and anhydrides thereof, and 2-carboxyethyl methacrylate.

The functional group monomer is preferably 1 to 35% by mass, more preferably 3 to 32% by mass, and still more preferably 6 to 30% by mass with respect to the total amount of the monomers constituting the acrylic-based polymer (b).

In addition to the foregoing, the acrylic-based polymer (b) may contain a structural unit derived from a monomer copolymerizable with the above-mentioned acrylic-based monomers such as styrene, α-methylstyrene, vinyltoluene, vinyl formate, vinyl acetate, acrylonitrile, and acrylamide.

The above-mentioned acrylic-based polymer (b) can be used as a non-energy ray curable adhesive resin I (acrylic-based resin). Examples of the energy ray curable acrylic resin include those obtained by reacting a compound having a photopolymerizable unsaturated group (also referred to as an unsaturated group-containing compound) with the functional group of the above-mentioned acrylic-based polymer (b).

The unsaturated group-containing compound is a compound having both a substituent which can be bonded to a functional group of the acrylic-based polymer (b) and a photopolymerizable unsaturated group. Examples of the photopolymerizable unsaturated group include a (meth)acryloyl group, a vinyl group, an allyl group, and a vinylbenzyl group, and a (meth)acryloyl group is preferable.

Examples of the substituent which can be bonded to the functional group contained in the unsaturated group-containing compound include an isocyanate group and a glycidyl group. Accordingly, examples of the unsaturated group-containing compound include (meth)acryloyloxyethyl isocyanate, (meth)acryloyl isocyanate, and glycidyl (meth)acrylate.

It is preferable that the unsaturated group-containing compound reacts with part of a functional group of the acrylic-based polymer (b), and specifically, it is preferable that the unsaturated group-containing compound reacts with 50 to 98 mol % of the functional group of the acrylic-based polymer (b), and more preferably 55 to 93 mol %. In this manner, in the energy ray curable acrylic resin, part of the functional group remains without being reacted with the unsaturated group-containing compound, and this facilitates crosslinking with a crosslinking agent.

The weight average molecular weight (Mw) of the acrylic-based resin is preferably from 300000 to 1600000, more preferably 400000 to 1400000, and still more preferably 500000 to 1200000.

(Energy Ray Curable Compound)

The energy ray curable compound contained in the X-type or XY-type adhesive composition is preferably a monomer or an oligomer having an unsaturated group in its molecule, and capable of being polymerized and cured by irradiation with energy ray.

Examples of such energy ray curable compounds include multivalent (meth)acrylate monomers such as trimethylolpropane tri(meth)acrylate, pentaerythritol (meth)acrylate, pentaerythritol tetra(meth)acrylate, dipentaerythritol hexa(meth)acrylate, 1,4-butylene glycol di(meth)acrylate, 1,6-hexanediol (meth)acrylate, and oligomers such as urethane (meth)acrylate, polyester (meth)acrylate, polyether (meth)acrylate, and epoxy (meth)acrylate.

Among these, a urethane (meth)acrylate oligomer is preferable, considering a fact that it is relatively high in molecular weight and does not tend to reduce the shear storage elastic modulus of the pressure sensitive adhesive layer.

The molecular weight (the weight average molecular weight for an oligomer) of the energy ray curable compound is preferably 100 to 12000, more preferably 200 to 10000, still more preferably 400 to 8000, and particularly preferably 600 to 6000.

The content of the energy ray curable compound in the X-type adhesive composition is preferably 40 to 200 parts by mass, more preferably 50 to 150 parts by mass, and still more preferably 60 to 90 parts by mass with respect to 100 parts by mass of the adhesive resin.

Meanwhile, the content of the energy ray curable compound in the XY-type adhesive composition is preferably 1 to 30 parts by mass, more preferably 2 to 20 parts by mass, and still more preferably 3 to 15 parts by mass with respect to 100 parts by mass of the adhesive resin. In the XY-type adhesive composition, since the adhesive resin is energy ray curable, it is possible to sufficiently reduce the releasing force after irradiation with energy ray even if the content of the energy ray curable compound is small.

(Crosslinking Agent)

It is preferable that the adhesive composition further contains a crosslinking agent. The crosslinking agent, for example, reacts with a functional group derived from a functional group monomer included in the adhesive resin and thereby achieves a crosslink between the adhesive resins. Examples of the crosslinking agent include isocyanate-based crosslinking agents such as tolylene diisocyanate and hexamethylene diisocyanate, and adducts thereof; epoxy-based crosslinking agents such as ethylene glycol glycidyl ether; aziridine-based crosslinking agents such as hexane [1-(2-methyl)-aziridinyl] triphosphatriazine; and chelating-based crosslinking agents such as aluminum chelate. One kind of these crosslinking agents may be used by itself or two or more kinds may be combined for use.

Among these, an isocyanate-based crosslinking agent is preferable in view of increasing the cohesive force to improve the adhesive strength, and in view of availability.

Considering promoting the crosslinking reaction, the amount of the crosslinking agent is preferably 0.01 to 10 parts by mass, more preferably 0.03 to 7 parts by mass, and still more preferably 0.05 to 4 parts by mass with respect to 100 parts by mass of the adhesive resin.

(Photopolymerization Initiator)

If the adhesive composition is energy ray curable, the adhesive composition preferably further contains a photopolymerization initiator. By containing the photopolymerization initiator, it is possible to sufficiently promote the curing reaction of the adhesive composition even with energy ray of relatively low energy such as ultraviolet rays.

Examples of the photopolymerization initiator include benzoin compounds, acetophenone compounds, acylphosphinoxide compounds, titanocene compounds, thioxanthone compounds, peroxide compounds, and photosensitizers such as amines and quinones, and more specific examples thereof include 1-hydroxycyclohexyl phenyl ketone, 2-hydroxy-2-methyl-1-phenyl-propan-1-one, benzoin, benzoin methyl ether, benzoin ethyl ether, benzoin isopropyl ether, benzylphenyl sulfide, tetramethylthiuram monosulfide, azobisisobutyrol nitrile, dibenzyl, diacetyl, 8-chloranthraquinone, and bis (2,4,6-trimethylbenzoyl) phenylphosphine oxide.

One kind of these photopolymerization initiators may be used by itself or two or more kinds may be combined for use.

The content of the photopolymerization initiator is preferably 0.01 to 10 parts by mass, more preferably 0.03 to 5 parts by mass, and still more preferably 0.05 to 5 parts by mass with respect to 100 parts by mass of the adhesive resin.

(Other Additives)

The adhesive composition may contain other additives as long as the effects of the present invention would not be impaired. Examples of other additives include an antistatic agent, an antioxidant, a softener (plasticizer), a filler, a rust inhibitor, a pigment, and a dye. When such an additive is to be combined, the content of the additive is preferably 0.01 to 6 parts by mass with respect to 100 parts by mass of the adhesive resin.

In view of improving the coatability to the base, the buffer layer, and the release sheet, the adhesive composition may be further diluted with an organic solvent to be a form of solution of the adhesive composition.

Examples of the organic solvent include methyl ethyl ketone, acetone, ethyl acetate, tetrahydrofuran, dioxane, cyclohexane, n-hexane, toluene, xylene, n-propanol, and isopropanol.

Regarding these organic solvents, the organic solvent used for the synthesis of the adhesive resin may be used as it is, or one or more kinds of organic solvents other than the one used for the synthesis may be added so that it is possible to uniformly apply the solution of the adhesive composition.

[Release Sheet]

A release sheet may be adhered to a surface of the pressure sensitive adhesive tape. Specifically, the release sheet is adhered to the surface of the pressure sensitive adhesive layer of the pressure sensitive adhesive tape. The release sheet protects the pressure sensitive adhesive layer during transportation and storage by being adhered to the surface of the pressure sensitive adhesive layer. The release sheet is detachably adhered to the pressure sensitive adhesive tape and is released from the pressure sensitive adhesive tape and removed therefrom before the pressure sensitive adhesive tape is used (that is, before the wafer is adhered).

As the release sheet, a release sheet having at least one surface subjected to a releasing treatment is used, and a specific example is a release sheet with a base for the release sheet to a surface of which a release agent is applied.

The base for the release sheet is preferably a resin film, and examples of the resin constituting the resin film include a polyester resin film such as a polyethylene terephthalate resin, a polybutylene terephthalate resin, and a polyethylene naphthalate resin, and a polyolefin resin such as a polypropylene resin, and a polyethylene resin. Examples of the release agent include a silicone-based resin, an olefin-based resin, an isoprene-based resin, a rubber-based elastomer such as a butadiene-based resin, a long-chain alkyl-based resin, an alkyd-based resin, and a fluorine-based resin.

Although the thickness of the release sheet is not particularly limited, it is preferably 10 to 200 μm, and more preferably 20 to 150 μm.

[Method for Producing Pressure Sensitive Adhesive Tape]

A method for producing the pressure sensitive adhesive tape of the present invention is not particularly limited, and can be produced by a known method.

For example, the following is a method for producing the pressure sensitive adhesive tape having the base, the buffer layer provided on one surface of the base, and the pressure sensitive adhesive layer provided on the other surface of the base.

In a case in which the buffer layer is formed of the buffer layer-forming composition that contains an energy ray polymerizable compound, the buffer layer provided by coating and curing the buffer layer-forming composition on a release sheet is adhered to the base, and the release sheet is then removed, a laminate of the buffer layer and the base is thereby obtained. In addition, in a case in which the buffer layer is a layer containing a polyolefin resin film, a laminate of the buffer layer and the base is obtained by adhering the buffer layer and the base to each other.

Then, the pressure sensitive adhesive layer provided on the release sheet is adhered to the base side of the laminate, and the pressure sensitive adhesive tape in which the release sheet is adhered to the surface of the pressure sensitive adhesive layer can be thus produced. The release sheet adhered to the surface of the pressure sensitive adhesive layer may be appropriately released and removed before use of the pressure sensitive adhesive tape.

As a method for forming the buffer layer on the release sheet, the buffer layer may be formed, by directly applying the buffer layer-forming composition on the release sheet by a known coating method to form a coating film, and then irradiating the coating film with energy ray. Alternatively, the buffer layer may be formed by directly applying the buffer layer-forming composition to one surface of the base and heat-drying or irradiating the coating film with energy ray.

Examples of the coating method of the buffer layer-forming composition include spin coating, spray coating, bar coating, knife coating, roll coating, blade coating, die coating, and gravure coating. In addition, in order to improve the coatability, the buffer layer-forming composition may be combined with an organic solvent, and may be coated on the release sheet in a form of a solution.

If the buffer layer-forming composition contains an energy ray polymerizable compound, it is preferable to cure the coating film of the buffer layer-forming composition by irradiating energy ray, and to thereby form the buffer layer. Curing of the buffer layer may be achieved by curing processing performed once or a plurality of individual times. For example, after the coating film on the release sheet is completely cured to thereby form the buffer layer, the buffer layer thus obtained may be adhered to the base, and alternatively, a buffer layer-forming film in a semi-cured state may be formed without completely curing the coating film, and the buffer layer-forming film may be adhered to the base and the buffer layer may be then completely cured by irradiation with energy ray, and to thereby form the buffer layer. Ultraviolet rays are preferable as energy ray used for irradiation in the curing treatment. Although the coating film of the buffer layer-forming composition may be exposed at the time of curing, it is preferable that curing is performed with energy ray irradiation in a state in which the coating film is covered with the release sheet or the base and thereby unexposed.

If the buffer layer is a layer including a polyolefin resin film, the buffer layer may be adhered to the base by extrusion lamination. Specifically, the polyolefin resin constituting the buffer layer is molten and kneaded by using a T-die film machine, for example, and the molten polyolefin resin is extruded and laminated on one surface of the base while moving the base at a constant speed. The buffer layer may be directly laminated on the base by heat sealing, for example. Moreover, the buffer layer may be laminated with an easy-adhesion layer in between by a method such as dry lamination.

As a method for forming the pressure sensitive adhesive layer on the release sheet, the pressure sensitive adhesive layer can be formed by directly coating the adhesive (adhesive composition) to the release sheet by a known coating method and heat-drying the coating film.

The pressure sensitive adhesive layer may be formed by directly coating the adhesive (adhesive composition) to one surface of the base. Examples of the method for applying the adhesive include spray coating, bar coating, knife coating, roll coating, blade coating, die coating, and gravure coating, which are shown in the method for producing the buffer layer.

A method for producing the pressure sensitive adhesive tape in which the buffer layer is provided on both surfaces of the base may be performed by, for example, obtaining a laminate in which the buffer layer, the base and the buffer layer are laminated in this order, and then forming the pressure sensitive adhesive layer on one of the buffer layers.

[Method for Producing a Semiconductor Device]

The pressure sensitive adhesive tape according to the present invention is preferably used in DBG by being adhered to a surface of a semiconductor wafer when back side grinding of the wafer is performed. In particular, the pressure sensitive adhesive tape according to the present invention is preferably used in LDBG in which a group of chips each having a small kerf width is obtained when a semiconductor wafer is diced. The term "a group of chips" refers to a plurality of semiconductor chips having a wafer shape retained on the pressure sensitive adhesive tape according to the present invention.

As a non-limiting example of use of the pressure sensitive adhesive tape, a method for producing a semiconductor device will now be specifically described.

Specifically, the method for producing the semiconductor device includes at least steps 1 to 4 below.

Step 1: adhering the above-mentioned pressure sensitive adhesive tape to a front surface of a semiconductor wafer.

Step 2: forming a groove from the front surface of the semiconductor wafer or forming a modified region inside the semiconductor wafer from the front surface or a back surface of the semiconductor wafer.

Step 3: dicing the semiconductor wafer, of which the pressure sensitive adhesive tape is adhered to the front surface and the above-mentioned groove or the modified region is formed, using the groove or the modified region as a starting point for forming a plurality of chips by grinding the semiconductor wafer from the back surface.

Step 4: releasing the pressure sensitive adhesive tape from the diced semiconductor wafer (that is, the plurality of chips).

Each of the steps of the above-mentioned method for producing the semiconductor device will now be described in detail.

(Step 1)

In step 1, the pressure sensitive adhesive tape of the present invention is adhered to the front surface of the semiconductor wafer with the pressure sensitive adhesive layer in between. This step may be performed before step 2, which will be described later, but may be performed after step 2. For example, if the modified region is to be formed in the semiconductor wafer, step 1 is preferably performed before step 2. Meanwhile, if the groove is formed in the front surface of the semiconductor wafer by, for example, dicing, step 1 is performed after step 2. That is, the pressure sensitive adhesive tape is adhered in this step 1 to the front surface of the wafer having the groove formed in step 2, which will be described later.

The semiconductor wafer used in the present producing method may be a silicon wafer, or may be a wafer of, for example, gallium arsenide, silicon carbide, lithium tantalate, lithium niobate, gallium nitride, indium phosphide, or a glass wafer. The thickness of the semiconductor wafer before grinding is not particularly limited, but is typically about 500 to 1000 µm. In addition, the semiconductor wafer typically has circuits formed on a surface thereof. Formation of circuits on the wafer surface can be performed by various methods including conventional methods such as etching and lift-off that have been generally used.

(Step 2)

In step 2, the groove is formed from the front surface of the semiconductor wafer, or the modified region is formed inside the semiconductor wafer from the front surface or the back surface of the semiconductor wafer.

The groove formed in this step is a groove having a depth lower than the thickness of the semiconductor wafer. The groove can be formed by dicing using a conventionally known wafer dicing apparatus, for example. In step 3 that will be described later, the semiconductor wafer is divided into a plurality of semiconductor chips along the groove.

In addition, the modified region is a brittle portion in the semiconductor wafer, and is a region as a starting point where the semiconductor wafer is thinned by grinding in the grinding step, and the semiconductor wafer is broken by, for example, force applied by grinding and thereby diced into the semiconductor chips. That is, in step 2, the groove and the modified region are formed along a dividing line to be used when the semiconductor wafer is divided into semiconductor chips in step 3 that will be described later.

The modified region is formed by irradiation with laser beams focused on the inside of the semiconductor wafer, and the modified region is formed inside the semiconductor wafer. The laser irradiation may be performed from the side of the front surface or the side of the back surface of the semiconductor wafer. In the aspect of forming the modified region, if step 2 is performed after step 1 and laser irradiation is performed from the front surface of the wafer, the semiconductor wafer is to be irradiated with laser beam through the pressure sensitive adhesive tape.

The semiconductor wafer to which the pressure sensitive adhesive tape is adhered and in which the modified region or the groove is formed is placed on a chuck table and is sucked and retained by the chuck table. At this time, the side of the front surface of the semiconductor wafer is disposed on a side of the table and is sucked.

(Step 3)

After steps 1 and 2, the back surface of the semiconductor wafer on the chuck table is ground to dice the semiconductor wafer into a plurality of semiconductor chips.

Here, if the groove is formed in the semiconductor wafer, the back side grinding is performed so as to reduce the thickness of the semiconductor wafer at least to a position reaching the bottom of the groove. By this back side grinding, the groove is formed into a cut penetrating the wafer, and the semiconductor wafer is divided at the cut and thereby diced into individual semiconductor chips.

Meanwhile, in the case in which the modified region is formed, the grinding surface (the back surface of the wafer) may reach the modified region by grinding, but may not precisely reach the modified region. That is, the semiconductor wafer may be ground to a position adjacent to the modified region so that the semiconductor wafer is broken with the modified region as a starting point and diced into semiconductor chips. For example, the actual dicing of the semiconductor chips may be performed by adhering a pickup tape that will be described later and then stretching the pickup tape.

After the completion of the back side grinding, dry polishing may be performed prior to picking up the chips.

Each of the diced semiconductor chips may have a square shape or an elongated shape such as a rectangular shape. The thickness of the diced semiconductor chips is not particularly limited, but is preferably about 5 to 100 µm, and more preferably 10 to 45 µm. According to LDBG in which the modified region is provided inside the wafer by a laser, and the wafer is diced by, for example, a stress at the time of back side grinding of the wafer, it is easy to define that the thickness of the diced semiconductor chips is 50 µm or less, and more preferably 10 to 45 µm. The size of the diced semiconductor chips is not particularly limited, but is preferably less than 600 mm$^2$, more preferably less than 400 mm$^2$, and still more preferably less than 300 mm$^2$.

When the pressure sensitive adhesive tape of the present invention is used, even in such thin and/or small-sized semiconductor chips, occurrence of cracks is prevented in the semiconductor chips at the time of the back side grinding (step 3) and at the time of the releasing of the pressure sensitive adhesive tape (step 4).

(Step 4)

Next, the pressure sensitive adhesive tape for semiconductor processing is released from the diced semiconductor wafer (that is, a plurality of semiconductor chips). This step is performed, for example, by the following method.

First, in a case in which the pressure sensitive adhesive layer of the pressure sensitive adhesive tape is formed of an energy ray curable adhesive, the pressure sensitive adhesive layer is cured by irradiation with energy ray. Next, a pickup tape is adhered to the side of the back surface of the diced semiconductor wafer, and the position and the direction are aligned so as to allow picking-up. At this time, a ring frame disposed on the outer peripheral side of the wafer is also adhered to the pickup tape, and the outer peripheral edge portion of the pickup tape is fixed to the ring frame. The pickup tape may be adhered to the wafer and the ring frame at the same time, or may be adhered at different timings. The pressure sensitive adhesive tape is then released from the plurality of semiconductor chips retained on the pickup tape.

Thereafter, a plurality of semiconductor chips on the pickup tape are picked up and fixed on, for example, a substrate to produce a semiconductor device.

The pickup tape is not particularly limited, but is formed of, for example, an adhesive sheet including a base and a pressure sensitive adhesive layer provided on one surface of the base.

In addition, an adhesive tape may be used instead of the pickup tape. Examples of the adhesive tape include a laminate of a film-shaped adhesive and a release sheet, a laminate of a dicing tape and a film-shaped adhesive, a dicing die-bonding tape made of an adhesive layer having functions of both a dicing tape and a die-bonding tape, and a release sheet. In addition, before adhering the pickup tape, the film-shaped adhesive may be adhered to the side of the back surface of the diced semiconductor wafer. If the film-shaped adhesive is used, the film-shaped adhesive may have a shape identical to the shape of the wafer.

In the case in which the adhesive tape is used or the film-shaped adhesive is adhered to the side of the back surface of the semiconductor wafer which is diced before the pickup tape is adhered, the plurality of semiconductor chips on the adhesive tape or the pickup tape are picked up together with the adhesive layer divided into shapes identical to the shapes of the semiconductor chips. The semiconductor chips are then fixed on, for example, a substrate with the adhesive layer in between, to thereby produce the semiconductor device. The dicing of the adhesive layer is performed through the use of a laser or by expansion.

Although the pressure sensitive adhesive tape according to the present invention is described above with the examples used for the method of dicing the semiconductor wafer by DBG or LDBG, the pressure sensitive adhesive tape according to the present invention can be preferably used in LDBG in which a group of chips that is thinner and has a kerf width is obtained when dicing the semiconductor wafer. The pressure sensitive adhesive tape according to the present invention can also be used for typical back side grinding, and can also be used to temporarily retain a workpiece at the time of processing of, for example, glass or ceramic. In addition, it can also be used as various types of re-releasable pressure sensitive adhesive tapes.

Second Embodiment

In the second embodiment of the present invention, the pressure sensitive adhesive tape refers to a laminate including a base and a pressure sensitive adhesive layer provided on at least one surface of the base. Furthermore, the pressure sensitive adhesive tape does not exclude inclusion of constituent layers other than these constituent layers. For example, the pressure sensitive adhesive layer may include a pressure sensitive adhesive layer provided on at least one surface of the base and a buffer layer provided on the other surface of the base. A primer layer may be formed on the surface of the base on a side of the pressure sensitive adhesive layer, and a release sheet for protecting the pressure sensitive adhesive layer until use may be laminated on the surface of the pressure sensitive adhesive layer. In addition, the base may be single layered or multiple layered. The same applies to the pressure sensitive adhesive layer.

The configuration of respective members of the pressure sensitive adhesive tape for semiconductor processing according to the second embodiment will now be described in further detail.

The outline of the second embodiment of the present invention will now be given.

[1] A pressure sensitive adhesive tape for semiconductor processing including:

a base having a Young's modulus of 1000 MPa or more at 23° C., and a pressure sensitive adhesive layer, wherein (N)×(C) which is the product of (N) and (C) is 500 or more at 30° C., and 9000 or less at 60° C., where (N) [μm] is the thickness of the pressure sensitive adhesive layer and (C) μm is a creep amount.

[2] The pressure sensitive adhesive tape for semiconductor processing according to [1], wherein the pressure sensitive adhesive layer has a shear storage elastic modulus of 0.03 MPa or more at 30° C., and a shear storage elastic modulus of 0.20 MPa or less at 60° C.

[3] The pressure sensitive adhesive tape for semiconductor processing according to [1] or [2], wherein the pressure sensitive adhesive layer has a thickness of 100 μm or less.

[4] A method for producing a semiconductor device including steps of:

adhering the pressure sensitive adhesive tape for semiconductor processing according to any one of [1] to [3] above, to a front surface of a semiconductor wafer;

forming a groove from the front surface of the semiconductor wafer or forming a modified region inside the semiconductor wafer from the front surface or a back surface of the semiconductor wafer;

dicing the semiconductor wafer, of which the pressure sensitive adhesive tape is adhered to the front surface and the groove or the modified region is formed, using the groove or the modified region as a starting point for forming a plurality of chips by grinding the semiconductor wafer from the back surface; and releasing the pressure sensitive adhesive tape from the plurality of chips.

[Pressure Sensitive Adhesive Layer]

The pressure sensitive adhesive layer may be single layered or multiple layered. In the second embodiment, when an adhesive sheet is adhered to a semiconductor wafer, the pressure sensitive adhesive layer refers to a layer interposed between the base and the wafer. If there exist a plurality of layers between the base and the wafer, these plurality of layers are treated as a single pressure sensitive adhesive layer. Therefore, if there exists a single pressure sensitive adhesive layer between the base and the wafer, properties of the pressure sensitive adhesive layer such as a creep amount, a thickness and a shear storage elastic modulus are the properties of the single pressure sensitive adhesive layer itself, and if there exist a plurality of layers between the base and the wafer, the properties are those of the plurality of layers treated as a single pressure sensitive adhesive layer. That is, if there exists a single pressure sensitive adhesive layer between the base and the wafer, a range of values of each of the properties should be satisfied by the single pressure sensitive adhesive layer, and if there exist a plurality of layers between the base and the wafer, a range of values of each of the properties should be satisfied by the plurality of layers treated as a single pressure sensitive adhesive layer. If the base is made of a plurality of layers, the plurality of layers are treated as a single base as long as a Young's modulus of the plurality of layers at 23° C. is 1000 MPa or more. For example, if a Young's modulus of the base with which an easy-adhesion layer is provided is 1000 MPa or more at 23° C., the base and the easy-adhesion layer is treated as a single base and the easy-adhesion layer is not included in the pressure sensitive adhesive layer.

In the second embodiment, the product (N)×(C) of (N) and (C) is 500 or more at 30° C., and 9000 or less at 60° C., where (N) μm is the thickness of the pressure sensitive adhesive layer and (C) μm is the creep amount. A surface of a semiconductor wafer has circuits, for example, formed thereon, and is typically uneven. By defining that the product (N)×(C) is 500 or more at 30° C., when the pressure sensitive adhesive tape is adhered to the uneven surface of the wafer, it is possible that the unevenness of the surface of the wafer and the pressure sensitive adhesive layer are adequately brought into contact with each other, and the adhesiveness of the pressure sensitive adhesive layer is appropriately exhibited. It is therefore possible to reliably fix the pressure sensitive adhesive tape to the semiconductor wafer, and to appropriately protect the wafer surface at the time of back side grinding. Furthermore, when the semiconductor wafer undergoes back side grinding by, for example, a grinder, the semiconductor wafer receives a compressive stress caused by pressing by the grinder, and a shear stress caused by rotation of the grinder. In the dicing before grinding method such as DBG or LDBG, die shift may be caused by a compressive stress and a shear stress at the time of back side grinding. By defining that the product (N)×(C) of the pressure sensitive adhesive layer is 9000 or less at 60° C., it is possible to suppress die shift even if the temperature of the semiconductor wafer rises to around 60° C. due to friction with, for example, the grinder.

In view of the foregoing, it is preferable that the product (N)×(C) of (N) and (C) for the pressure sensitive adhesive layer at 30° C. is 500 to 8000, and more preferably 1000 to 7000. In addition, it is preferable that the product (N)×(C) of (N) and (C) for the pressure sensitive adhesive layer at 60° C. is 0 to 8000, and more preferably 1000 to 7000.

The thickness (N) of the pressure sensitive adhesive layer is preferably less than 100 μm, more preferably 5 to 80 μm, and still more preferably 10 to 70 μm. If such a thin pressure sensitive adhesive layer is made, it is possible to reduce the proportion of a portion having a low rigidity in the pressure sensitive adhesive tape, and thus it is easy to prevent chipping of semiconductor chips that occurs at the time of back side grinding.

The creep amount (C) of the pressure sensitive adhesive layer is not particularly limited as long as the product (N)×(C) of (N) and (C) falls within the above-mentioned range, but it is preferable that the creep amount at 30° C. is more than 5 μm and more preferably 50 μm or more. It is preferable that the creep amount at 60° C. is 210 μm or less and more preferably 115 μm or less. If the creep amount of the pressure sensitive adhesive layer at 30° C. is 5 μm or less, there is a possibility that, when a pressure sensitive adhesive tape is to be adhered to an uneven surface of a wafer, the unevenness of the wafer surface and the pressure sensitive adhesive layer may not be adequately brought to contact with each other. Furthermore, if the creep amount at 60° C. is more than 210 μm, there is a possibility that the positions of chips may be displaced, resulting in die shift, when the temperature of the semiconductor wafer rises to around 60° C. at the time of back side grinding due to friction with, for example, a grinder.

The creep amount (C) of the pressure sensitive adhesive layer is obtained, based on JISZ0237 (2009), by adhering (by five reciprocations of a 2-kg roll) a pressure sensitive adhesive tape cut into a width of 25 mm by a length of 150 mm to an adherend (SUS304) for holding-power testing in line with a marking line thereof such that the adhered area has a width of 25 mm and a length of 25 mm to prepare a test sample, and then measuring holding power by using a holding power tester, applying a load (9.8 N) with a weight of 1 kg in environments of 30° C. and 60° C. The test duration is 10000 seconds, and a displacement amount thus obtained is defined as the creep amount (C) [μm].

Although the pressure sensitive adhesive layer is not particularly limited as long as it has an appropriate pressure-sensitive adhesiveness at a normal temperature, the pressure sensitive adhesive layer preferably has a shear storage elastic modulus of 0.03 MPa or more at 30° C. and a shear storage elastic modulus of 0.20 MPa or less at 60° C.

By setting the shear storage elastic modulus at 30° C. to 0.03 MPa or more, when the pressure sensitive adhesive tape is adhered to the uneven surface of the wafer, it is possible that the unevenness of the surface of the wafer and the pressure sensitive adhesive layer are adequately brought into contact with each other, and the adhesiveness of the pressure sensitive adhesive layer is appropriately exhibited. By setting the shear storage elastic modulus at 60° C. to 0.20 MPa or less, when the wafer is heated and a surface protection sheet is adhered (thermal lamination) to uneven portions such as circuits, the pressure sensitive adhesive layer follows the uneven portions of the wafer surface, allowing retention of the wafer with smaller non-contact regions of the uneven portions of the wafer and the pressure sensitive adhesive layer with respect to each other, and it is thereby possible to suppress die shift. In addition, the shear storage elastic modulus of the pressure sensitive adhesive layer means the shear storage elastic modulus before curing by irradiation with energy ray in a case in which the pressure sensitive adhesive layer is formed of an energy ray curable adhesive.

In view of the foregoing, the shear storage elastic modulus of the pressure sensitive adhesive layer at 30° C. is more preferably 0.05 to 0.18 MPa, and still more preferably 0.10 to 0.15 MPa. The shear storage elastic modulus of the pressure sensitive adhesive layer at 60° C. is more preferably 0.01 to 0.15 MPa, and more preferably 0.03 to 0.10 MPa.

The shear storage elastic modulus can be measured by the following method. A pressure sensitive adhesive layer having a thickness of approximately 0.5 to 1 mm is punched into a circular shape having a diameter of 7.9 mm, and is prepared as a measurement sample. Using a dynamic viscoelasticity measuring apparatus ARES manufactured by Rheometric Scientific Ltd., the elastic modulus of the measurement sample is measured where a temperature range of −30° C. to 150° C. is changed at a temperature increase rate of 3° C./min at a frequency of 1 Hz. The elastic modulus at the measurement temperature of 30° C. is defined as a shear storage elastic modulus at 30° C., and the elastic modulus at the measurement temperature of 60° C. is defined as a shear storage elastic modulus at 60° C.

Hereinafter, specific examples of the pressure sensitive adhesive layer of the second embodiment will be described in detail, but these are non-limiting examples, and the pressure sensitive adhesive layer of the present embodiment should not be construed as being limited thereto. The pressure sensitive adhesive layer may be single layered or multiple layered as long as the above-mentioned properties are satisfied.

The pressure sensitive adhesive layer is formed of, for example, an acrylic-based adhesive, a urethane-based adhesive, a rubber-based adhesive, a silicone-based adhesive, and an acrylic-based adhesive is preferable.

In addition, the pressure sensitive adhesive layer is preferably formed of an energy ray curable adhesive. With the pressure sensitive adhesive layer formed of an energy ray curable adhesive, it is possible to set the shear storage elastic modulus at 30° C. within the above-mentioned range before curing by energy ray irradiation and to easily set the releasing force to 1000 mN/50 mm or less after curing.

As the energy ray curable adhesive, an adhesive similar to that of the first embodiment can be used. For example, in addition to the non-energy ray curable adhesive resin (adhesive resin I), it is possible to use an energy ray curable adhesive composition (X-type adhesive composition) containing an energy ray curable compound other than the adhesive resin. In addition, as the energy ray curable adhesive, an adhesive composition (Y-type adhesive composition) may also be used, the adhesive composition containing, as a main constituent, an energy ray curable adhesive resin (adhesive resin II) having an unsaturated group introduced into a side chain of a non-energy ray curable adhesive resin, and the adhesive component containing no energy ray curable compound other than the adhesive resin.

Moreover, as the energy ray curable adhesive, a combination of an X-type and a Y-type may be used, that is, an energy ray curable adhesive composition (XY-type adhesive composition) containing an energy ray curable compound other than an adhesive resin, in addition to the energy ray curable adhesive resin II.

Among these, an XY-type adhesive composition is preferably used. By using the XY-type, it is possible to have a sufficient pressure sensitive adhesive property before curing and to have an adequately low releasing force with respect to the semiconductor wafer after curing.

However, the adhesive may be formed of a non-energy ray curable adhesive composition which is not curable when irradiated with energy rays. The non-energy ray curable adhesive composition does not contain the above-mentioned energy ray curable adhesive resin II and the energy ray curable compound while containing at least the non-energy ray curable adhesive resin I.

In the following description, the term "adhesive resin" is used as a term referring to one or both of the above-mentioned adhesive resin I and the adhesive resin II. Specific examples of the adhesive resin include an acrylic-based resin, a urethane-based resin, a rubber-based resin, and a silicone-based resin, and an acrylic-based resin is preferable.

The following is a more detailed description of an acrylic-based adhesive in which the acrylic-based resin is used as the adhesive resin.

As the acrylic-based resin, an acrylic-based polymer (b) is used. The acrylic-based polymer (b) is obtained by polymerizing a monomer containing at least alkyl (meth)acrylate, and includes a structural unit derived from the alkyl (meth) acrylate. Examples of the alkyl (meth)acrylate include those having 1 to 20 carbon atoms of the alkyl group, and the alkyl group may be linear or branched. Specific examples of the alkyl (meth)acrylate include methyl (meth)acrylate, ethyl (meth)acrylate, isopropyl (meth)acrylate, n-propyl (meth) acrylate, n-butyl (meth)acrylate, 2-ethylhexyl (meth)acrylate, n-octyl (meth)acrylate, isooctyl (meth)acrylate, nonyl (meth)acrylate, decyl (meth)acrylate, undecyl (meth)acrylate, dodecyl (meth)acrylate. One kind of the alkyl (meth) acrylates may be used by itself or two or more kinds may be combined for use.

In addition, the acrylic-based polymer (b) preferably contains a structural unit derived from an alkyl (meth) acrylate having 4 or more carbon atoms of an alkyl group in view of improving the pressure sensitive adhesive strength of the pressure sensitive adhesive layer. The alkyl (meth) acrylate preferably has 4 to 12 carbon atoms, and more preferably 4 to 6 carbon atoms. The alkyl (meth)acrylate having 4 or more carbon atoms of an alkyl group is preferably alkyl acrylate.

In the acrylic-based polymer (b), the alkyl (meth)acrylate having 4 or more carbon atoms of an alkyl group is preferably 40 to 98% by mass, more preferably 45 to 95% by mass, and still more preferably 50 to 90% by mass with respect to the total amount of the monomers constituting the acrylic-based polymer (b) (referred to simply as "total amount of the monomer" in the following description).

In order to adjust the modulus and the pressure sensitive adhesive property of the pressure sensitive adhesive layer, it is preferable that the acrylic-based polymer (b) is a copolymer containing a structural unit derived from alkyl (meth) acrylate having 1 to 3 carbon atoms of an alkyl group, in addition to a structural unit derived from alkyl (meth) acrylate having 4 or more carbon atoms of an alkyl group. The alkyl (meth)acrylate is preferably alkyl (meth)acrylate having 1 or 2 carbon atoms, more preferably methyl (meth) acrylate, and most preferably methyl methacrylate. In the acrylic-based polymer (b), the alkyl (meth)acrylate having 1 to 3 carbon atoms of an alkyl group is preferably 1 to 50% by mass, more preferably 20 to 50% by mass, and still more preferably 30 to 50% by mass with respect to the total amount of the monomer. By setting the content of the alkyl (meth)acrylate having 1 to 3 carbon atoms in the alkyl group to the above-mentioned range, it is possible to reduce the creep amount (C) of the pressure sensitive adhesive layer at 60° C.

The acrylic-based polymer (b) preferably has a structural unit derived from a functional group-containing monomer, in addition to the structural unit derived from the above-mentioned alkyl (meth)acrylate. Examples of the functional group of the functional group-containing monomer include a hydroxyl group, a carboxy group, an amino group, and an epoxy group. The functional group-containing monomer reacts with a crosslinking agent, which will be described later to cause crosslinking, or reacts with an unsaturated group-containing compound to introduce an unsaturated group to a side chain of the acrylic-based polymer (b).

Examples of the functional group-containing monomer include a hydroxyl group-containing monomer, a carboxy group-containing monomer, an amino group-containing monomer, and an epoxy group-containing monomer. One kind of these monomers may be used by itself or two or more kinds may be combined for use. Among these, a hydroxyl group-containing monomer and a carboxy group-containing monomer are preferable, and a hydroxyl group-containing monomer is more preferable.

Examples of the hydroxyl group-containing monomer include hydroxyalkyl (meth)acrylate such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth) acrylate; and unsaturated alcohols such as vinyl alcohol and allyl alcohol.

Examples of the carboxy group-containing monomer include an ethylenically unsaturated monocarboxylic acid such as a (meth)acrylic acid and a crotonic acid; and an ethylenically unsaturated dicarboxylic acid such as a fumaric acid, an itaconic acid, a maleic acid and a citraconic acid, and anhydrides thereof, and 2-carboxyethyl methacrylate.

The functional group monomer is preferably 1 to 35% by mass, more preferably 3 to 32% by mass, and still more preferably 6 to 30% by mass with respect to the total amount of the monomers constituting the acrylic-based polymer (b).

In addition to the foregoing, the acrylic-based polymer (b) may contain a structural unit derived from a monomer copolymerizable with the above-mentioned acrylic-based monomers such as styrene, α-methylstyrene, vinyltoluene, vinyl formate, vinyl acetate, acrylonitrile, and acrylamide.

The above-mentioned acrylic-based polymer (b) can be used as a non-energy ray curable adhesive resin I (acrylic-based resin). Examples of the energy ray curable acrylic resin include those obtained by reacting a compound with a photopolymerizable unsaturated group (also referred to as an unsaturated group-containing compound) with the functional group of the above-mentioned acrylic-based polymer (b).

The unsaturated group-containing compound is a compound having both a substituent which can be bonded to a functional group of the acrylic-based polymer (b) and a photopolymerizable unsaturated group. Examples of the photopolymerizable unsaturated group include a (meth) acryloyl group, a vinyl group, an allyl group, and a vinylbenzyl group, and a (meth)acryloyl group is preferable.

Examples of the substituent which can be bonded to the functional group contained in the unsaturated group-containing compound include an isocyanate group and a glycidyl group. Accordingly, examples of the unsaturated group-containing compound include (meth)acryloyloxyethyl isocyanate, (meth)acryloyl isocyanate, and glycidyl (meth)acrylate.

It is preferable that the unsaturated group-containing compound reacts with part of a functional group of the acrylic-based polymer (b), and specifically, it is preferable that the unsaturated group-containing compound reacts with 50 to 98 mol % of the functional group of the acrylic-based polymer (b), and more preferably 55 to 93 mol %. In this manner, in the energy ray curable acrylic resin, part of the functional group remains without being reacted with the unsaturated group-containing compound, and this facilitates crosslinking with a crosslinking agent.

The weight average molecular weight (Mw) of the acrylic-based resin is preferably from 300000 to 1600000, more preferably 400000 to 1400000, and still more preferably 500000 to 1200000.

In the second embodiment, the creep amount of the pressure sensitive adhesive layer can be increased or decreased by adjusting the shear storage elastic modulus based on the type and amount of the crosslinking agent and the type and amount of the monomer.

The energy ray curable compound, the crosslinking agent, the photopolymerization initiator, and other additives of the pressure sensitive adhesive layer of the second embodiment may be the same as those of the first embodiment.

The base, the buffer layer, the release sheet, and the method for producing the semiconductor device of the second embodiment can also be the same as those of the first embodiment.

The method for producing the pressure sensitive adhesive tape may be the same as that of the first embodiment, except that the buffer layer may or may not be provided.

EXAMPLES

The present invention will now be described in more detail based on Examples, but the present invention is not limited by these Examples.

Examples 1 to 6 and Comparative Example 1

A measurement method and an evaluation method in Examples 1 to 6 and Comparative Example 1 will be given below.

[Young's Modulus]

The Young's modulus of the base was calculated from a chart of tensile strength and elongation obtained by performing a tensile test using a tensile tester. Specifically, a measurement film having a width of 15 mm, a length of 150 mm and a thickness of 50 μm made of the same material as the film or the sheet constituting the base was prepared. The measurement film was placed in a tensile and compression tester (trade name "Tensilon" manufactured by A&D Company, Limited) so that the stretchable portion of the measurement film was 100 mm. Measurement was then performed at 23° C. with the test speed of 200 mm/min, and the Young's modulus was calculated from the slope at the origin of the obtained chart.

[Tensile Storage Elastic Modulus and Tan δ]

A buffer layer-forming film having a thickness of 0.2 mm and made of the buffer layer-forming composition used in Examples 1 to 4 and Comparative Example 1 was formed on a first release sheet, and a second release sheet was adhered on the buffer layer-forming film. For the first and second release sheets, polyethylene terephthalate films (trade name "SP-PET381031" manufactured by Lintec Corporation, thickness: 38 μm) was used, on which a silicone release treatment had been performed.

Ultraviolet rays were then applied again to a side of the first release sheet to completely cure the above-mentioned buffer layer-forming film and to thereby form a test buffer layer having a thickness of 0.2 mm. The above-mentioned ultraviolet irradiation was performed by using a belt conveyor type ultraviolet irradiation apparatus (an apparatus name "ECS-401GX" manufactured by EYE GRAPHICS Co., Ltd.) and a high-pressure mercury lamp (an apparatus name "H04-L41" manufactured by EYE GRAPHICS Co., Ltd.) under an irradiation condition in which a lamp height was 150 mm, a lamp power was 3 kW (conversion output of 120 mW/cm), an illuminance was 160 mW/cm$^2$ at a ray wavelength of 365 nm, and an irradiation dose was 500 mJ/cm$^2$.

The release sheets on both sides of the prepared test buffer layer were removed, which was followed by measurement of tensile storage elastic modulus and tensile loss elastic modulus performed on ten test pieces each cut into a width of 4 mm and a length of 50 mm at a measurement frequency of 1 Hz and a temperature rise rate of 3° C./min in a temperature range of −5 to 120° C. by an automatic dynamic viscoelasticity tester (product name "Rheovibron DDV-0.1FP" manufactured by ORIENTEC CORPORATION). Regarding Examples 5 and 6, measurement the same as mentioned above was performed except that buffer layers (LDPE having a thickness of 27.5 μm) used in Examples 5 and 6 were laminated, and a test buffer layer having a thickness of 0.1 mm was used.

An average value of values of the "tensile loss elastic modulus/tensile storage elastic modulus" at respective temperatures is calculated as tan δ of the temperature, and the maximum values of tan δ in the range of −5 to 120° C. are shown as the "maximum value of tan δ of the buffer layer" in Table 1.

The average value of the tensile storage elastic modulus at 23° C. was defined as $E_{23}$ and the average value of the tensile storage elastic modulus at 60° C. was defined as $E_{60}$, and the average value of the tensile storage elastic modulus at 90° C. was defined as $E_{90}$.

[Cracks]

The pressure sensitive adhesive tapes for semiconductor processing produced in Examples and Comparative Example were adhered to a silicon wafer having a diameter of 12 inches and a thickness of 775 μm by using a tape laminator for back side grinding (trade name "RAD-3510F/12" manufactured by Lintec Corporation). A lattice-shaped modified region was formed in the wafer by using a laser saw (an apparatus name "DFL 7361" manufactured by DISCO Corporation). The lattice size was 11 mm by 8 mm.

Next, grinding (including dry polishing) was performed to a thickness of 20 μm by using a back side grinding apparatus (apparatus name "DGP8761" manufactured by DISCO Corporation) to dice the wafer into a plurality of chips. After the grinding step, irradiation with energy ray (ultraviolet rays) was performed, and a dicing tape (Adwill D-176 manufactured by Lintec Corporation) was then adhered to a surface opposite to an adhesion surface of the pressure sensitive adhesive tape for semiconductor processing, which was followed by releasing off the pressure sensitive adhesive tape for semiconductor processing. Thereafter, the diced chips were observed with a digital microscope, and the chips with cracks formed therein were counted and classified according to the following criteria for respective sizes of the cracks. The size (μm) of each of the cracks was obtained by comparing the length (μm) of the crack along the longitudinal direction of the chip to the length (μm) of the crack along the lateral direction of the chip and choosing a larger value of the lengths.

(Reference)

Large cracks: the crack size of more than 50 μm.

Medium cracks: the crack size of 20 μm or more and 50 μm or less.

Small cracks: the crack size of less than 20 μm.

A crack occurrence rate (%) was calculated based on the equation below. If the crack occurrence rate was 2.0% or less, the number of large cracks was 0, the number of medium cracks was 10 or less, and the number of small cracks was 20 or less, this case was evaluated as "good" and the other cases were evaluated as "poor".

Crack occurrence rate (%)=number of chips with cracks/total number of chips×100

All parts by mass of the following Examples and Comparative Example are expressed in terms of solid content.

Example 1

(1) Base

As the base, a PET film with an easy-adhesion layer on both sides (Cosmoshine A4300 manufactured by Toyobo Co., Ltd., thickness: 50 μm, Young's modulus at 23° C.: 2550 MPa) was prepared.

(2) Buffer Layer (Synthesis of Urethane Acrylate Based Oligomer)

A terminal isocyanate urethane prepolymer obtained by a reaction between polycarbonate diol and isophorone diisocyanate was reacted with 2-hydroxyethyl acrylate to thereby obtain a urethane acrylate based oligomer (UA-1) having a weight average molecular weight (Mw) of approximately 5000.

(Preparation of Buffer Layer-Forming Composition)

50 parts by mass of the above synthesized urethane acrylate based oligomer (UA-1), 30 parts by mass of isobornyl acrylate (IBXA), 40 parts by mass of tetrahydrofurfuryl acrylate (THFA), and 15 parts by mass of dipentaerythritol hexaacrylate (DPHA) were combined, and 1.0 part by mass of 2-hydroxy-2-methyl-1-phenyl-propan-1-one (product name "Irgacure1173" manufactured by BASF Japan Ltd.) as a photopolymerization initiator was further combined to thereby prepare the buffer layer-forming composition.

(3) Pressure Sensitive Adhesive Layer (Preparation of Adhesive Composition)

With the acrylic-based polymer (b) obtained by copolymerization of 52 parts by mass of n-butyl acrylate (BA), 20 parts by mass of methyl methacrylate (MMA), and 28 parts by mass of 2-hydroxyethyl acrylate (2HEA), 2-methacryloyloxyethyl isocyanate (MOI) was reacted so as to be added to 90 mol % of hydroxyl groups of all of the hydroxyl groups of the acrylic-based polymer (b) to thereby obtain an energy ray curable acrylic-based resin (Mw: 500000).

To 100 parts by mass of this energy ray curable acrylic resin, 6 part by mass of polyfunctional urethane acrylate as an energy ray curable compound, 1 part by mass of an isocyanate based crosslinking agent (product name "Coronate L" manufactured by Tosoh Corporation), and 1 part by mass of bis (2,4,6-trimethylbenzoyl) phenylphosphine oxide as a photopolymerization initiator were combined, and diluted with methyl ethyl ketone to thereby prepare a coating liquid of the adhesive composition having a solid content concentration of 32% by mass.

(4) Fabrication of the Pressure Sensitive Adhesive Tape

The above-mentioned coating liquid of the composition obtained was applied to a release treatment surface of a release sheet (trade name "SP-PET381031" manufactured by Lintec Corporation) and heat-dried with to form the pressure sensitive adhesive layer having a thickness of 30 μm on the release sheet.

The buffer layer-forming composition was applied to the release treatment surface of another release sheet (trade name "SP-PET381031" manufactured by Lintec Corporation) to form a coating film. Next, the coating film was irradiated with ultraviolet rays to semi-cure the coating film, to thereby form the buffer-layer forming film having a thickness of 53 μm.

The above-mentioned ultraviolet irradiation was performed by using a belt conveyor type ultraviolet irradiation apparatus (apparatus name "US2-0801" manufactured by EYE GRAPHICS Co., Ltd.) and a high-pressure mercury lamp (apparatus name "H08-L41" manufactured by EYE GRAPHICS Co., Ltd.) under an irradiation condition in which a lamp height was 230 mm, an output was 80 mW/cm, an illuminance was 90 mW/cm² at a ray wavelength of 365 nm, and an irradiation dose was 50 mJ/cm².

The surface of the buffer-layer forming film thus formed was adhered to the base, and irradiation with ultraviolet rays was performed again from the side of the release sheet on the buffer-layer forming film, and the buffer-layer forming film was thereby completely cured, and to thereby form the buffer layer having a thickness of 53 μm. The above-mentioned ultraviolet irradiation was performed by using the above-mentioned ultraviolet irradiation apparatus and the high-pressure mercury lamp under an irradiation condition in which a lamp height was 220 mm, a conversion output was 120 mW/cm, an illuminance was 160 mW/cm² at a ray wavelength of 365 nm, and an irradiation dose was 350 mJ/cm².

The pressure sensitive adhesive layer was then adhered to a surface of the base opposite to the surface thereof on which the buffer layer was formed, to thereby fabricate the pressure sensitive adhesive tape for semiconductor processing.

Example 2

The pressure sensitive adhesive tape was obtained in a manner the same as in Example 1 except that the content of DPHA was changed to 20 parts by mass in preparation of the buffer layer-forming composition.

Example 3

The pressure sensitive adhesive tape was obtained in the same manner as in Example 1 except that 20 parts by mass of pentaerythritol triacrylate (PETA, triester 57%, product name "A-TMM-3LM-N", manufactured by Shin-Nakamura Chemical Co., Ltd.) in place of DPHA in preparation of the buffer-layer forming composition.

Example 4

The pressure sensitive adhesive tape was obtained in the same manner as in Example 1 except that the following buffer layer-forming composition was used as the buffer layer-forming composition.
(Synthesis of Urethane Acrylate Based Oligomer) A terminal isocyanate urethane prepolymer obtained by a reaction between polyester diol and isophorone diisocyanate was reacted with 2-hydroxyethyl acrylate to thereby obtain a urethane acrylate based oligomer (UA-2) having a weight average molecular weight (Mw) of approximately 5000.
(Preparation of Buffer Layer-Forming Composition)
50 parts by mass of the urethane acrylate based oligomer (UA-2), 40 parts by mass of isobornyl acrylate (IBXA), 20 parts by mass of 2-hydroxy-3-phenoxypropyl acrylate (HPPA), and 10 parts by mass of pentaerythritol triacrylate (PETA) were combined, and 1.0 part by mass of 2-hydroxy-2-methyl-1-phenyl-propan-1-one (product name "Irgacure1173" manufactured by BASF Japan Ltd.) as a photopolymerization initiator was further combined to thereby prepare the buffer layer-forming composition.

Example 5

A low-density polyethylene film (thickness: 27.5 μm) was prepared as a buffer layer.

The base the same as that of Example 1 was used, and the buffer layer was laminated on both surfaces of the base by dry lamination to thereby obtain a laminate of the base and the buffer layer laminated in the order of LDPE, PET and LDPE.

The pressure sensitive adhesive layer was adhered to the obtained laminate in a manner the same as in Example 1 to thereby obtain the pressure sensitive adhesive tape for semiconductor processing.

Example 6

The pressure sensitive adhesive tape was obtained in a manner the same as in Example 5 except that the thickness of the pressure sensitive adhesive layer was 60 μm.

Comparative Example 1

The pressure sensitive adhesive tape was obtained in the same manner as in Example 1 except that the following buffer layer-forming composition was used as the buffer layer-forming composition.
(Preparation of Buffer Layer-Forming Composition)
50 parts by mass of a urethane acrylate based oligomer (UA-2), 40 parts by mass of isobornyl acrylate (IBXA), and 20 parts by mass of 2-hydroxy-3-phenoxypropyl acrylate (HPPA) were combined, and 1.0 part by mass of 2-hydroxy-2-methyl-1-phenyl-propan-1-one (product name "Irgacure1173" manufactured by BASF Japan Ltd.) as a photopolymerization initiator was further combined to thereby prepare the buffer layer-forming composition.

TABLE 1

| | base | buffer layer | | | | pressure sensitive adhesive layer | crack | | | | |
|---|---|---|---|---|---|---|---|---|---|---|---|
| | Young's modulus | tensile storage elastic modulus (MPa) | | | maximum value of | total thickness | large crack | medium crack | small crack | ocurrence rate | |
| | (MPa) | 23° C. | 60° C. | 90° C. | tan δ | (μm) | (number) | (number) | (number) | (%) | evaluation |
| example 1 | 2550 | 669 | 124 | 26 | 0.5 | 30 | 0 | 0 | 4 | 0.6 | good |
| example 2 | 2550 | 1066 | 280 | 29 | 0.4 | 30 | 0 | 1 | 15 | 2.0 | good |
| example 3 | 2550 | 875 | 157 | 27 | 0.4 | 30 | 0 | 1 | 5 | 0.7 | good |
| example 4 | 2550 | 213 | 40 | 15 | 0.5 | 30 | 0 | 1 | 4 | 0.6 | good |
| example 5 | 2550 | 350 | 104 | 40 | 0.2 | 30 | 0 | 2 | 7 | 1.1 | good |
| example 6 | 2550 | 350 | 104 | 40 | 0.2 | 60 | 0 | 0 | 12 | 1.5 | good |
| comparative example 1 | 2550 | 182 | 2 | 2 | 1.2 | 30 | 3 | 5 | 20 | 3.5 | poor |

The foregoing results indicate that the pressure sensitive adhesive tape for semiconductor processing according to the present invention can reduce occurrence of cracks. In particular, the adhesive sheet for semiconductor processing according to the present invention can reduce the number of occurrences of large cracks and medium cracks. Chips having large cracks or medium cracks are likely to be broken with a progression of cracks in the producing steps of the semiconductor device. Thus, it can be seen that the use of the pressure sensitive adhesive tape according to the present invention leads to an improved productivity of the semiconductor device.

Examples 7 to 17 and Comparative Examples 2 to 6

A measurement method and an evaluation method in Examples 7 to 17 and Comparative Examples 2 to 6 will be given below.

[Shear Storage Elastic Modulus G']

The shear storage elastic modulus G' of the buffer layer was obtained under the following condition by using a viscoelasticity measuring apparatus (DYNAMIC ANALYZER RDA II, manufactured by Rheometric Scientific Ltd.), by measuring samples in each of which a single-layered adhesive was laminated, which had been formed from a solution of the adhesive composition used in Examples 7 to 17 and Comparative Examples 2 to 6.
Sample size: a diameter of 8 mm and a thickness of 3 mm
Measuring temperature: 30° C. and 60° C.
Measuring frequency: 1 Hz

[Creep Amount (C)]

Based on JISZ0237 (2009), a pressure sensitive adhesive tape cut into a width of 25 mm by a length of 150 mm was adhered (by five reciprocations of a 2-kg roll) to an adherend (SUS304) for holding-power testing in line with a marking line thereof such that the adhered area has a width of 25 mm and a length of 25 mm to prepare a test sample, and then measuring holding power by using a holding power tester, applying a load (9.8 N) with a weight of 1 kg in environments of 30° C. and 60° C. The test duration was 10000 seconds, and a displacement amount thus obtained was defined as a creep amount (C) [μm].

[Thickness (N)]

The thickness of the base (a resin film constituting the base) was measured based on JISK7130 by using a constant pressured thickness measuring instrument (product name "PG-02" manufactured by TECLOCK Corporation). The thickness (N) of the pressure sensitive adhesive layer is a value [μm] obtained by measuring the thickness of the surface protection sheet with a PET film subjected to a silicone release treatment, and from this thickness subtracting the thicknesses of the base and the PET film subjected to the silicone release treatment.

[(N)×(C)]

The product (N)×(C) of the thickness (N) of the pressure sensitive adhesive layer and the creep amount (C) of the pressure sensitive adhesive layer obtained by the above-described creep test was calculated.

[Die Shift and Crack Occurrence Rate]

An adhesive sheet for semiconductor processing produced in Examples and Comparative Examples was adhered to a silicon wafer having a diameter of 12 inches and a thickness of 775 μm by using the RAD-3510F/12 manufactured by Lintec Corporation, and stealth dicing was performed to obtain a chip size of 11 mm by 8 mm by using the DFL7361 manufactured by DISCO Corporation. Next, grinding (dry polishing) was performed until the thickness of 20 μm was obtained by using the DGP8761 manufactured by DISCO Corporation. Next, energy ray (ultraviolet-ray) irradiation was performed using the RAD-2700 F/12 manufactured by Lintec Corporation, and a dicing tape (Adwill D-821HS manufactured by Lintec Corporation) was adhered to the opposite side of the bonding surface of the adhesive sheet for semiconductor processing, and the adhesive sheet for semiconductor processing was released. Thereafter, the diced chips were observed with a digital microscope (VHX-1000 manufactured by KEYENCE CORPORATION), and the magnitude of die shift and the crack occurrence rate were evaluated as will be described below.

(Magnitude of Die Shift)

As shown in FIG. 1, four points (A to D) in an outer peripheral portion and one point (E) in a center portion of a semiconductor wafer 10 were observed with a digital microscope. At point A, kerf widths L1 to L4 of the neighboring four chips 11 were measured, and the average value $A_{ave}$ [(L1+L2+L3+L4)/4] was calculated. Similarly, the average values $B_{ave}$, $C_{ave}$, $D_{ave}$ and $E_{ave}$ of the kerf widths L1 to L4 at the respective points B, C, D and E were calculated. The magnitude of die shift was evaluated based on the value of $\alpha/\beta$ where the average value [$(A_{ave}+B_{ave}+C_{ave}+D_{ave})/4$] of $A_{ave}$, $B_{ave}$, $C_{ave}$, and $D_{ave}$ of the outer peripheral portion was $\alpha$ and the $E_{ave}$ of the center portion was $\beta$.
1 (excellent): $\alpha/\beta \leq 3.0$
2 (good): $3.0 < \alpha/\beta \leq 5.0$
3 (poor): $5.0 < \alpha/\beta$ (Crack Occurrence Rate)

The diced chips were observed with the digital microscope, the chips with cracks formed therein were counted, the crack occurrence rate was calculated using the equation below, and evaluated according to the following criteria.

Crack occurrence rate (%)=number of chips with cracks/total number of chips×100

1 (excellent): crack occurrence rate (%)≤2.0%
2 (good): 2.0%<crack occurrence rate≤3.0%
3 (poor): 3.0%<crack occurrence rate Example 7

(1) Base

As the base, a PET film with an easy-adhesion layer on both sides (Cosmoshine A4300 manufactured by Toyobo Co., Ltd., thickness: 50 μm, Young's modulus at 23° C.: 2550 MPa, and breaking strength: 55.3 MJ/m$^3$) was prepared.

(2) Laminate (Base and Buffer Layer)

A low-density polyethylene film (thickness: 27.5 μm) was prepared as a buffer layer.

The buffer layer was laminated on both surfaces of the base by dry lamination to thereby obtain a laminate (A1) of the base and the buffer layer laminated in the order of LDPE, PET and LDPE.

(3) Pressure Sensitive Adhesive Layer (Preparation of Adhesive Composition B1)

With the acrylic-based polymer (b1) obtained by copolymerization of 40 parts by mass of n-butyl acrylate (BA), 30 parts by mass of methyl methacrylate (MMA), and 28 parts by mass of 2-hydroxyethyl acrylate (2HEA), 2-methacryloyloxyethyl isocyanate (MOI) was reacted so as to be added to 90 mol % of hydroxyl groups of all of the hydroxyl groups of the acrylic-based polymer (b1) to thereby obtain an energy ray curable acrylic-based resin (Mw: 500000).

To 100 parts by mass of this energy ray curable acrylic-based resin, 6 part by mass of polyfunctional urethane acrylate as an energy ray curable compound, 1 part by mass of an isocyanate based crosslinking agent (product name "Coronate L" manufactured by Tosoh Corporation), and 1 part by mass of bis (2,4,6-trimethylbenzoyl) phenylphosphine oxide as a photopolymerization initiator were combined, and diluted with methyl ethyl ketone to thereby prepare a coating liquid of the adhesive composition (B1) having a solid content concentration of 35% by mass.

(4) Fabrication of the Pressure Sensitive Adhesive Tape

The above-mentioned coating liquid of the composition obtained was applied to a release treatment surface of a release sheet (trade name "SP-PET381031" manufactured by Lintec Corporation) and heat-dried to form the pressure sensitive adhesive layer having a thickness of 40 μm on the release sheet.

Thereafter, the pressure sensitive adhesive layer was adhered to the laminate (A1) to thereby fabricate the pressure sensitive adhesive tape for semiconductor processing.

Example 8

The pressure sensitive adhesive tape for semiconductor processing was obtained in a manner the same as in Example 7 except that the thickness of the pressure sensitive adhesive layer was changed to 20 μm.

Example 9

The pressure sensitive adhesive tape for semiconductor processing was obtained in a manner the same as in Example 7 except that the thickness of the pressure sensitive adhesive layer was changed to 60 μm.

Example 10

The pressure sensitive adhesive tape for semiconductor processing was obtained in a manner the same as in Example 7 except that the adhesive composition was changed to B2 that will be described below and the thickness of the pressure sensitive adhesive layer was changed to 30 μm.

(Preparation of Adhesive Composition B2)

With the acrylic-based polymer (b2) obtained by copolymerization of 73 parts by mass of n-butyl acrylate (BA), 10 parts by mass of dimethyl methacrylate (DMMA), and 17 parts by mass of 2-hydroxyethyl acrylate (2HEA), 2-methacryloyloxyethyl isocyanate (MOI) was reacted so as to be added to 83 mol % of hydroxyl groups of all of the hydroxyl groups of the acrylic-based polymer (b2) to thereby obtain an energy ray curable acrylic-based resin (Mw: 500000).

To 100 parts by mass of this energy ray curable acrylic-based resin, 6 part by mass of polyfunctional urethane acrylate as an energy ray curable compound, 1 part by mass of an isocyanate based crosslinking agent (product name "Coronate L" manufactured by Tosoh Corporation), and 1 part by mass of bis (2,4,6-trimethylbenzoyl) phenylphosphine oxide as a photopolymerization initiator were combined, and diluted with methyl ethyl ketone to thereby prepare a coating liquid of the adhesive composition (B2) having a solid content concentration of 32% by mass.

Example 11

The pressure sensitive adhesive tape for semiconductor processing was obtained in a manner the same as in Example 10 except that the thickness of the pressure sensitive adhesive layer was changed to 40 μm.

Example 12

The pressure sensitive adhesive tape for semiconductor processing was obtained in the same manner as in Example 7 except that the adhesive composition was changed to B3 and the thickness of the pressure sensitive adhesive layer was changed to 30 μm.

(Preparation of Adhesive Composition B3)

An acrylic-based resin (Mw: 500000) was given by copolymerization of 73 parts by mass of n-butyl acrylate (BA), 8 parts by mass of methyl methacrylate (MMA), 3 parts by weight of acrylic acid (AA), and 5 parts by mass of 2-hydroxyethyl acrylate (2HEA).

To 100 parts by mass of the acrylic resin, 40 parts by mass of polyfunctional urethane acrylate as an energy ray curable compound, 1 part by mass of isocyanate based crosslinking agent (product name "Coronate L" manufactured by Tosoh Corporation), and 1 part by mass of bis (2,4,6-trimethylbenzoyl) phenylphosphine oxide as a photopolymerization initiator were combined, and diluted with methyl ethyl ketone to thereby prepare a coating liquid of the adhesive composition (B3) having a solid content concentration of 32% by mass.

Example 13

The pressure sensitive adhesive tape for semiconductor processing was obtained in the same manner as in Example 7 except that the adhesive composition was changed to B4 that will be described below.

(Preparation of Adhesive Composition B4)

With the acrylic-based polymer (b1) obtained by copolymerization of 32 parts by mass of n-butyl acrylate (BA), 40 parts by mass of methyl methacrylate (MMA), and 28 parts by mass of 2-hydroxyethyl acrylate (2HEA), 2-methacryloyloxyethyl isocyanate (MOI) was reacted so as to be added to 90 mol % of hydroxyl groups of all of the hydroxyl groups of the acrylic-based polymer (b1) to thereby obtain an energy ray curable acrylic-based resin (Mw: 500000).

To 100 parts by mass of this energy ray curable acrylic-based resin, 6 parts by mass of polyfunctional urethane acrylate as an energy ray curable compound, 1 part by mass of isocyanate based crosslinking agent (product name "Coronate L" manufactured by Tosoh Corporation), and 1 part by mass of bis (2,4,6-trimethylbenzoyl) phenylphosphine oxide as a photopolymerization initiator were combined, and diluted with methyl ethyl ketone to thereby prepare a coating liquid of the adhesive composition (B4) having a solid content concentration of 35% by mass.

Example 14

The pressure sensitive adhesive tape for semiconductor processing was obtained in the same manner as in Example 7 except that the laminate was changed to A2 that will be described below.

(1) Base

As the base, a PET film with an easy-adhesion layer on both sides (Cosmoshine A4300 manufactured by Toyobo Co., Ltd., thickness: 50 μm, Young's modulus at 23° C.: 2550 MPa, and breaking strength: 55.3 MJ/m$^3$) was prepared.

(2) Buffer Layer
(Synthesis of Urethane Acrylate Based Oligomer)

A terminal isocyanate urethane prepolymer obtained by a reaction between polycarbonate diol and isophorone diisocyanate was reacted with 2-hydroxyethyl acrylate to thereby obtain a urethane acrylate based oligomer (UA-1) having a weight average molecular weight (Mw) of approximately 5000.
(Preparation of Buffer Layer-Forming Composition)

50 parts by mass of the above synthesized urethane acrylate based oligomer (UA-1), 30 parts by mass of isobornyl acrylate (IBXA), 40 parts by mass of tetrahydrofurfuryl acrylate (THFA), and 15 parts by mass of dipentaerythritol hexaacrylate (DPHA) were combined, and 1.0 part by mass of 2-hydroxy-2-methyl-1-phenyl-propan-1-one (product name "Irgacure1173" manufactured by BASF Japan Ltd.) as a photopolymerization initiator was further combined to thereby prepare the buffer layer-forming composition (a2).

Furthermore, the buffer layer-forming composition (a2) was applied to the release-treated surface of another release sheet (trade name "SP-PET381031" manufactured by Lintec Corporation) to form a coating film. Next, the coating film was irradiated with ultraviolet rays to semi-cure the coating film, to thereby form the buffer layer-forming film having a thickness of 53 µm.

The above-mentioned ultraviolet irradiation was performed by using a belt conveyor type ultraviolet irradiation apparatus (apparatus name "US2-0801" manufactured by EYE GRAPHICS Co., Ltd.) and a high-pressure mercury lamp (apparatus name "H08-L41" manufactured by EYE GRAPHICS Co., Ltd.) under an irradiation condition in which a lamp height was 230 mm, an output was 80 mW/cm, an illuminance was 90 mW/cm$^2$ at a ray wavelength of 365 nm, and an irradiation dose was 50 mJ/cm$^2$.

The surface of the buffer-layer forming film thus formed was adhered to the base, and irradiation with ultraviolet rays was performed again from the aide of the release sheet on the buffer-layer forming film, and the buffer-layer forming film was thereby completely cured, and to thereby form the buffer layer having a thickness of 53 µm to obtain the laminate (A2). The above-mentioned ultraviolet irradiation was performed by using the above-mentioned ultraviolet irradiation apparatus and the high-pressure mercury lamp under an irradiation condition in which a lamp height was 220 mm, a conversion output was 120 mW/cm, an illuminance was 160 mW/cm$^2$ at a ray wavelength of 365 nm, and an irradiation dose was 350 mJ/cm$^2$.

Example 15

The pressure sensitive adhesive tape for semiconductor processing was obtained in the same manner as in Example 14 except that the adhesive composition was changed to B2.

Example 16

The pressure sensitive adhesive tape for semiconductor processing was obtained in the same manner as in Example 14 except that the adhesive composition was changed to B5 that will be described below and the thickness of the pressure sensitive adhesive layer was changed to 30 µm.
(Preparation of Adhesive Composition B5)

With the acrylic-based polymer (b) obtained by copolymerization of 52 parts by mass of n-butyl acrylate (BA), 20 parts by mass of methyl methacrylate (MMA), and 28 parts by mass of 2-hydroxyethyl acrylate (2HEA), 2-methacryloyloxyethyl isocyanate (MOI) was reacted so as to be added to 90 mol % of hydroxyl groups of all of the hydroxyl groups of the acrylic-based polymer (b) to thereby obtain an energy ray curable acrylic-based resin (Mw: 500000).

To 100 parts by mass of this energy ray curable acrylic-based resin, 6 parts by mass of polyfunctional urethane acrylate as an energy ray curable compound, 1 part by mass of isocyanate based crosslinking agent (product name "Coronate L" manufactured by Tosoh Corporation), and 1 part by mass of bis (2,4,6-trimethylbenzoyl) phenylphosphine oxide as a photopolymerization initiator were combined, and diluted with methyl ethyl ketone to thereby prepare a coating liquid of the adhesive composition (B5) having a solid content concentration of 32% by mass.

Example 17

The pressure sensitive adhesive tape for semiconductor processing was obtained in the same manner as in Example 7 except that the adhesive composition was changed to B6 that will be described below.
(Preparation of Adhesive Composition B6)

With the acrylic-based polymer (b1) obtained by copolymerization of 74 parts by mass of n-butyl acrylate (BA), 20 parts by mass of methyl methacrylate (MMA), and 6 parts by mass of 2-hydroxyethyl acrylate (2HEA), 2-methacryloyloxyethyl isocyanate (MOI) was reacted so as to be added to 50 mol % of hydroxyl groups of all of the hydroxyl groups of the acrylic-based polymer (b1) to thereby obtain an energy ray curable acrylic-based resin (Mw: 500000).

To 100 parts by mass of this energy ray curable acrylic-based resin, 6 parts by mass of polyfunctional urethane acrylate as an energy ray curable compound, 0.2 part by mass of isocyanate based crosslinking agent (product name "Coronate L" manufactured by Tosoh Corporation), and 1 part by mass of bis (2,4,6-trimethylbenzoyl) phenylphosphine oxide as a photopolymerization initiator were combined, and diluted with toluene to thereby prepare a coating liquid of the adhesive composition (B6) having a solid content concentration of 35% by mass.

Comparative Example 2

The pressure sensitive adhesive tape for semiconductor processing was obtained in a manner the same as in Example 7 except that the thickness of the pressure sensitive adhesive layer was changed to 80 µm.

Comparative Example 3

The pressure sensitive adhesive tape for semiconductor processing was obtained in a manner the same as in Example 10 except that the thickness of the pressure sensitive adhesive layer was changed to 60 µm.

Comparative Example 4

The pressure sensitive adhesive tape for semiconductor processing was obtained in a manner the same as in Example 12 except that the thickness of the pressure sensitive adhesive layer was changed to 45 µm.

Comparative Example 5

The pressure sensitive adhesive tape for semiconductor processing was obtained in a manner the same as in Example 12 except that the thickness of the pressure sensitive adhesive layer was changed to 60 µm.

Comparative Example 6

The pressure sensitive adhesive tape for semiconductor processing was obtained in a manner the same as in Example 14 except that the thickness of the pressure sensitive adhesive layer was changed to 80 μm.

TABLE 2

| | laminate | adhesive | pressure sensitive adhesive layer thickness (μm) [N] | G' (MPa) 30° C. | G' (MPa) 60° C. | creep amount (μm) [c] 30° C. | creep amount (μm) [c] 60° C. | [N × C] 30° C. | [N × C] 60° C. | die shift | crack occurrence rate |
|---|---|---|---|---|---|---|---|---|---|---|---|
| example 7 | A1 | B1 | 40 | 0.12 | 0.06 | 70 | 95 | 2800 | 3800 | 1 | 1 |
| example 8 | A1 | B1 | 20 | 0.12 | 0.06 | 65 | 83 | 1300 | 1660 | 1 | 1 |
| example 9 | A1 | B1 | 60 | 0.12 | 0.06 | 75 | 107 | 4500 | 6420 | 1 | 1 |
| example 10 | A1 | B2 | 30 | 0.05 | 0.03 | 110 | 137 | 3300 | 4110 | 1 | 1 |
| example 11 | A1 | B2 | 40 | 0.05 | 0.03 | 120 | 145 | 4800 | 5800 | 1 | 1 |
| example 12 | A1 | B3 | 30 | 0.03 | 0.01 | 135 | 202 | 4050 | 6060 | 1 | 1 |
| example 13 | A1 | B4 | 40 | 0.13 | 0.07 | 67 | 91 | 2680 | 3640 | 1 | 1 |
| example 14 | A2 | B1 | 40 | 0.12 | 0.06 | 71 | 97 | 2840 | 3880 | 1 | 1 |
| example 15 | A2 | B2 | 40 | 0.05 | 0.03 | 120 | 145 | 4800 | 5800 | 1 | 1 |
| example 16 | A2 | B5 | 30 | 0.11 | 0.05 | 70 | 95 | 2100 | 2850 | 1 | 1 |
| example 17 | A1 | B6 | 40 | 0.11 | 0.06 | 74 | 93 | 2960 | 3720 | 1 | 1 |
| comparative example 2 | A1 | B1 | 60 | 0.12 | 0.06 | 61 | 118 | 6460 | 9440 | 3 | 3 |
| comparative example 3 | A1 | B2 | 60 | 0.05 | 0.03 | 132 | 161 | 7920 | 9660 | 3 | 3 |
| comparative example 4 | A1 | B3 | 45 | 0.03 | 0.01 | 151 | 212 | 6795 | 9540 | 3 | 3 |
| comparative example 5 | A1 | B3 | 60 | 0.03 | 0.01 | 168 | 230 | 10080 | 13800 | 3 | 3 |
| comparative example 6 | A2 | B1 | 80 | 0.12 | 0.06 | 81 | 120 | 6480 | 9600 | 3 | 3 |

DESCRIPTION OF THE REFERENCE NUMERAL

10 Semiconductor wafer
11 Chip

What is claimed is:

1. A pressure sensitive adhesive tape for semiconductor processing, comprising:
    a base having a Young's modulus of 1000 MPa or more at 23° C.; and
    a pressure sensitive adhesive layer provided on at least one surface of the base,
    wherein the product (N)×(C) of (N) and (C) is 500 or more at 30° C., and 9000 or less at 60° C., where (N) [μm] is a thickness of the pressure sensitive adhesive layer and (C) [μm] is a creep amount,
    wherein the pressure sensitive adhesive layer has a thickness of 20 μm to 60 μm, and
    wherein the pressure sensitive adhesive layer comprises an acrylic-based polymer containing 20 to 40% by mass of structural units derived from an alkyl(meth) acrylate having an alkyl group of 1 to 3 carbon atoms.

2. The pressure sensitive adhesive tape for semiconductor processing according to claim 1, wherein the pressure sensitive adhesive layer has a shear storage elastic modulus of 0.03 MPa or more at 30° C., and a shear storage elastic modulus of 0.20 MPa or less at 60° C.

3. The pressure sensitive adhesive tape for semiconductor processing according to claim 1, wherein a thickness of the base is 110 μm or less.

4. A method for producing a semiconductor device, comprising:
    adhering the pressure sensitive adhesive tape for semiconductor processing according to claim 1 to a front surface of a semiconductor wafer;
    forming a groove from the front surface of the semiconductor wafer or forming a modified region inside the semiconductor wafer from the front surface or a back surface of the semiconductor wafer;
    dicing the semiconductor wafer, of which the pressure sensitive adhesive tape is adhered to the front surface and the groove or the modified region is formed, using the groove or the modified region as a starting point for forming a plurality of chips by grinding the semiconductor wafer from the back surface; and
    releasing the pressure sensitive adhesive tape from the plurality of chips.

* * * * *